(12) United States Patent
Mokhlesi

(10) Patent No.: US 7,633,802 B2
(45) Date of Patent: Dec. 15, 2009

(54) NON-REAL TIME REPROGRAMMING OF NON-VOLATILE MEMORY TO ACHIEVE TIGHTER DISTRIBUTION OF THRESHOLD VOLTAGES

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/344,779

(22) Filed: Dec. 29, 2008

(65) Prior Publication Data
US 2009/0103356 A1 Apr. 23, 2009

Related U.S. Application Data

(63) Continuation of application No. 11/425,790, filed on Jun. 22, 2006, now Pat. No. 7,486,561.

(51) Int. Cl.
G11C 11/34 (2006.01)

(52) U.S. Cl. .............................. 365/185.18; 365/185.24

(58) Field of Classification Search ............ 365/185.18, 365/185.24
See application file for complete search history.

(56) References Cited

U.S. PATENT DOCUMENTS

| | | | |
|---|---|---|---|
| 5,220,531 A | 6/1993 | Blyth |
| 5,313,421 A | 5/1994 | Guterman |
| 5,386,422 A | 1/1995 | Encoh |
| 5,412,601 A | 5/1995 | Sawada |
| 5,504,760 A | 4/1996 | Harari |
| 5,521,865 A | 5/1996 | Ohuchi |
| 5,522,580 A | 6/1996 | Varner, Jr. |
| 5,532,962 A | 7/1996 | Auclair |
| 5,570,315 A | 10/1996 | Tanaka |
| 5,652,719 A | 7/1997 | Tanaka |
| 5,657,332 A | 8/1997 | Auclair |
| 5,712,180 A | 1/1998 | Guterman |
| 5,712,815 A | 1/1998 | Bill |
| 5,761,222 A | 6/1998 | Baldi |
| 5,774,397 A | 6/1998 | Encoh |
| 5,844,912 A | 12/1998 | Sharpe-Geisler |

(Continued)

OTHER PUBLICATIONS

Johnson, William S., et al, Session XII: ROMs, PROMs and EROMs, 1980 IEEE International Solid State Circuits Conference, pp. 152-153.

(Continued)

*Primary Examiner*—Michael T Tran
(74) *Attorney, Agent, or Firm*—Vierra Magen Marcus & DeNiro LLP

(57) ABSTRACT

A set of non-volatile storage elements undergoes initial programming, after which a reprogramming, with higher verify levels, is performed in non-real time, such as when a control enters a standby mode, when no other read or write tasks are pending. The reprogramming can program pages in the set one at a time, stopping at a page boundary when another read or write task is pending, and restarting when the control become available again. Status flags can be provided to identify whether a page and/or the set has completed the reprogramming. In another aspect, a higher pass voltage is applied to unselected word lines during the reprogramming. In another aspect, an error count is determined using a default set of read voltages, and an alternative set of read voltages is selected if the count exceeds a threshold.

16 Claims, 13 Drawing Sheets

U.S. PATENT DOCUMENTS

| | | | |
|---|---|---|---|
| 5,867,429 | A | 2/1999 | Chen et al. |
| 5,870,344 | A | 2/1999 | Ozawa |
| 5,909,334 | A | 6/1999 | Barr |
| 5,949,714 | A | 9/1999 | Hemink |
| 6,046,935 | A | 4/2000 | Takeuchi |
| 6,134,104 | A | 10/2000 | Mohi |
| 6,137,729 | A | 10/2000 | Choi |
| 6,137,792 | A | 10/2000 | Jonas |
| 6,151,248 | A | 11/2000 | Harari |
| 6,222,762 | B1 | 4/2001 | Guterman |
| 6,266,270 | B1 | 7/2001 | Nobukata |
| 6,301,161 | B1 | 10/2001 | Holzmann |
| 6,317,364 | B1 | 11/2001 | Guterman |
| 6,424,566 | B1 | 7/2002 | Parker |
| 6,456,528 | B1 | 9/2002 | Chen |
| 6,519,184 | B2 | 2/2003 | Tanaka |
| 6,522,580 | B2 * | 2/2003 | Chen et al. ............ 365/185.02 |
| 6,525,964 | B2 | 2/2003 | Tanaka |
| 6,529,412 | B1 | 3/2003 | Chen |
| 6,532,172 | B2 | 3/2003 | Harari |
| 6,590,811 | B1 | 7/2003 | Hamilton |
| 6,657,891 | B1 | 12/2003 | Shibata |
| 6,751,129 | B1 | 6/2004 | Gongwer |
| 6,781,877 | B2 | 8/2004 | Cernea |
| 6,859,397 | B2 | 2/2005 | Lutze |
| 6,888,758 | B1 | 5/2005 | Hemink |
| 7,012,835 | B2 | 3/2006 | Gonzalez et al. |
| 7,023,736 | B2 | 4/2006 | Cernea |
| 7,046,568 | B2 | 5/2006 | Cernea |
| 7,057,939 | B2 | 6/2006 | Li |
| 7,196,928 | B2 | 3/2007 | Chen |
| 7,200,050 | B2 | 4/2007 | Kato |
| 7,200,235 | B1 | 4/2007 | Trimberger |
| 7,212,454 | B2 | 5/2007 | Kleveland |
| 7,447,076 | B2 * | 11/2008 | Mokhlesi ............... 365/185.18 |
| 7,486,561 | B2 * | 2/2009 | Mokhlesi ............... 365/185.18 |
| 7,489,549 | B2 * | 2/2009 | Mokhlesi ............... 365/185.18 |
| 2002/0118574 | A1 | 8/2002 | Gongwer |
| 2003/0137872 | A1 | 7/2003 | Shibata |
| 2003/0147278 | A1 | 8/2003 | Tanaka |
| 2004/0057287 | A1 | 3/2004 | Cernea |
| 2004/0109357 | A1 | 6/2004 | Cernea |
| 2004/0255090 | A1 | 12/2004 | Guterman |
| 2004/0268025 | A1 | 12/2004 | Matsubara |
| 2005/0024939 | A1 | 2/2005 | Chen |
| 2005/0088890 | A1 | 4/2005 | Matsunaga |
| 2005/0207222 | A1 | 9/2005 | Chen |
| 2005/0265114 | A1 | 12/2005 | Tanaka |
| 2006/0104104 | A1 | 5/2006 | Park |
| 2006/0107136 | A1 | 5/2006 | Gongwer |
| 2006/0126390 | A1 | 6/2006 | Gorobets |
| 2006/0140007 | A1 | 6/2006 | Cernea |
| 2006/0158947 | A1 | 7/2006 | Chan |
| 2006/0221700 | A1 | 10/2006 | Guterman |
| 2006/0274583 | A1 | 12/2006 | Lutze |
| 2006/0291285 | A1 | 12/2006 | Mokhlesi |
| 2007/0297226 | A1 | 12/2007 | Mokhlesi |
| 2007/0297245 | A1 | 12/2007 | Mokhlesi |

OTHER PUBLICATIONS

Kurata, Hideaki, et al., Constant-Charge-Injection Programming for 10-MB/s Multilevel AG-AND Flash Memories, 2002 Symposium On VLSI Circuits Digest of Technical Papers, pp. 302-303.

Nobukata, Hiromi, et al., A 144Mb 8-Level NAND Flash Memory with Optimized Pulse Width Programming, 1999 Symposium On VLSI Circuits Digest of Technical Papers, pp. 39-40.

Ohkawa, Masayoshi, et al., TP 2.3: A 98 mm2 3.3V 64Mb Flash Memory with FN-NOR Type 4-level Cell, 1996 IEEE International Solid-State Circuits Conference, pp. 36-37.

D.H. Kang et al., Novel Heat Dissipating Cell Scheme For Improving A Reset Distribution In A 512M Phase-Change Random Access Memory (PRAM), 2007 Symp. On VLSI Circuits Digest of Technical Papers, pp. 96-97, Jun. 14-16, 2007.

H. Tanaka et al., Bit Cost Scalable Technology With Punch And Plug Process For Ultra High Density Flash Memory, 2007 Symp. on VLSI Circuits Digest of Technical Papers, pp. 14-15, Jun. 14-16, 2007.

N. Shibata et al., A 70nm 16Gb 16-level-cell NAND Flash Memory, 2007 Symp. on VLSI Circuits Digest of Technical Papers, pp. 190-191, Jun. 14-16, 2007.

Y. Zhang et al., An Integrated Phase Change Memory Cell With Ge Nanowire Diode For Cross-Point Memory, 2007 Symp. on VLSI Circuits Digest of Technical Papers, pp. 98-99, Jun. 14-16, 2007.

Ditewig, "An embedded 1.2V-read flash memory module in a 0.18/ spl mu/m logic process," Solid-State Circuits Conference, 2001, Digest of Technical Papers. ISSCC, 2001 IEEE International Feb. 5-7, 2001, pp. 34-35, 425.

Jung, "a 117-MM 3.3-v Only 128-Mb Multilevel NAND Flash Memory for Mass Storage Applications," IEEE Journal of Solid-State Circuits, IEEE Service Center, vol. 31, No. 11, Nov. 1996.

International Search Report and Written Opinion dated Mar. 25, 2008, PCT Patent Application No. PCT/US2007/069711, filed May 25, 2007.

European Office Action dated Apr. 22, 2009, European Patent Application No. 07797758.5.

* cited by examiner

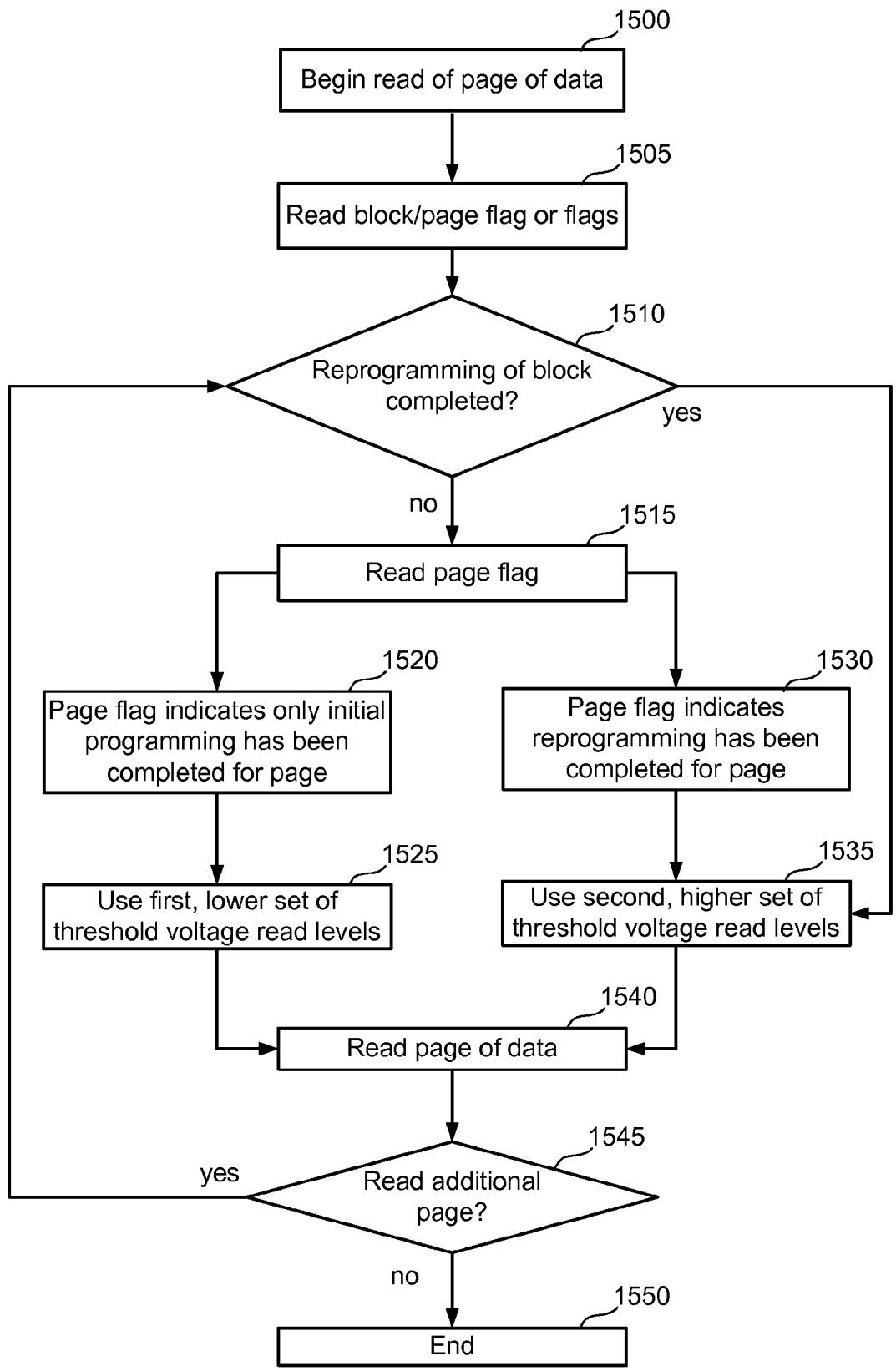

NON-REAL TIME REPROGRAMMING OF NON-VOLATILE MEMORY TO ACHIEVE TIGHTER DISTRIBUTION OF THRESHOLD VOLTAGES

CROSS-REFERENCE TO RELATED APPLICATIONS

This application is a continuation application of U.S. patent application Ser. No. 11/425,790, filed Jun. 22, 2006 (published as US2007/0297226 on Dec. 27, 2007), issued as U.S. Pat. No. 7,486,561 on Feb. 3, 2009, incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have storage elements which use a floating gate to store two ranges of charges and, therefore, can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage (Vpgm) applied to the control gate during a program operation is applied as a series of pulses that increase in magnitude over time. In one possible approach, the magnitude of the pulses is increased with each successive pulse by a predetermined step size, e.g., 0.4 V. Vpgm can be applied to the control gates of flash storage elements. In the periods between the program pulses, verify operations are carried out. That is, the programming level of each storage element of a set of storage elements being programmed in parallel is read between successive programming pulses to determine whether it is equal to or greater than a verify level to which the storage element is being programmed. For arrays of multi-state flash storage elements, a verification step may be performed for each state of an storage element to determine whether the storage element has reached its data-associated verify level. For example, a multi-state storage element capable of storing data in four states may need to perform verify operations for three compare points.

When programming an EEPROM or flash memory device, such as a NAND flash memory device, typically the program voltage is applied to the control gate and the bit line is grounded, causing electrons from the channel of a storage element to be injected into the floating gate. When electrons accumulate in the floating gate, the floating gate becomes negatively charged and the threshold voltage of the storage element is raised so that the storage element is in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," both of which are incorporated herein by reference in their entirety.

However, during programming of a selected storage element, neighboring storage elements may have their charge states altered due to field effect coupling, as described in U.S. Pat. No. 5,867,429, titled "High density non-volatile flash memory without adverse effects of electric field coupling between adjacent floating gates", and incorporated herein by reference. Generally, with field effect coupling, there is a shift in a storage element's threshold voltage due to a change in the amount of charge stored in neighboring storage elements. For example, a storage element on a given word line can be affected by capacitive coupling from storage elements on the same word line and on neighboring word lines. The coupling, which is strongest from the adjacent storage elements, causes the threshold voltage of a previously programmed storage element to be shifted higher. The threshold voltage distribution of a set of storage elements is likewise widened. This is undesirable, especially for multi-level storage elements, in which tighter threshold voltage distributions are advantageous.

SUMMARY OF THE INVENTION

The present invention addresses the above and other issues by providing a system and method for operating non-volatile storage in a manner which reduces capacitive coupling.

In one embodiment, operating non-volatile storage includes programming non-volatile storage elements via word lines, in an initial programming, starting from a first word line and proceeding successively to each next word line until a last word line is reached. After the initial programming is completed, the non-volatile storage elements are reprogrammed via the word lines. The initial programming and reprogramming may occur for a block of non-volatile storage elements, for example.

The non-volatile storage elements can be programmed using first and second sets of threshold voltage ($V_{TH}$) verify levels in the initial programming and the reprogramming, respectively, where each of the second set of $V_{TH}$ voltage verify levels is elevated relative to a corresponding level in the first set of $V_{TH}$ verify levels. In this manner, the $V_{TH}$ of the storage elements is shifted only incrementally in the reprogramming. Moreover, to manage the computational load, the reprogramming can be performed as a background process by a managing circuit when it would otherwise be in a standby mode. Furthermore, the reprogramming can be started, temporarily suspended, and subsequently resumed, in one or more start-suspend-resume cycles, based on the availability of the managing circuit. The reprogramming may occur page by page so that the reprogramming is suspended at the end of a page of data and resumed at the start of a next page. Flag bits may be used to indicate whether the reprogramming has occurred for each page, thereby allowing tracking of the programming status of each page. Flag bits can also be used at the block level to allow block level tracking. Flag bits at the page level can also provide block level tracking.

Moreover, a higher pass voltage (Vpass) can be applied to unselected word lines during the reprogramming than during the initial programming. During the reprogramming, since the storage elements residing under drain side word lines are no longer erased, more of the Vpass boosting potential has to be expended on reaching an inversion condition for these storage elements that may now be programmed to high threshold voltages. Accordingly, an increased Vpass can be helpful during reprogramming.

In another embodiment, operating non-volatile storage includes reading a first portion of a set of non-volatile storage elements using first $V_{TH}$ read levels, determining an error count from the reading, such as by using an error correcting and/or detecting code, and, if the error count exceeds a threshold, re-reading the first portion of the non-volatile storage elements using second $V_{TH}$ read levels, which differ from the first $V_{TH}$ read levels. Thus, an assumption can be made as to whether the first portion of non-volatile storage elements has undergone the initial programming only, in which case many errors will be detected if the first portion is read with the second $V_{TH}$ read levels instead of the first $V_{TH}$ read levels. Or, it can be assumed that the first portion of non-volatile storage elements has also undergone the reprogramming, in which case many errors may be detected if the first portion is read with the first $V_{TH}$ read levels instead of the second $V_{TH}$ read levels. If the assumption is incorrect, the first portion of non-volatile storage elements is re-read with the alternative $V_{TH}$ read levels. Moreover, a second portion of the non-volatile storage elements can be read, in an initial read attempt, using the same $V_{TH}$ read levels which were determined to be correct in reading the first portion. The portions of the non-volatile storage elements may store respective pages of data, so that programming proceeds on a page by page basis, and the correct $V_{TH}$ read levels are determined and used for each page.

In yet another embodiment, operating non-volatile storage includes programming non-volatile storage elements via word lines, in an initial programming, such that, when programming non-volatile storage elements associated with a given word line, a first pass voltage is applied to at least one other word line, and after the initial programming is completed, reprogramming the non-volatile storage elements via the word lines, such that, when reprogramming the non-volatile storage elements associated with the given one of the word lines, a second pass voltage, different than the first pass voltage, is applied to the at least one other word line. For example, the second pass voltage can be higher than the first pass voltage for the reasons discussed above.

Corresponding methods for operating non-volatile storage and non-volatile storage systems are provided. The non-volatile storage systems include a set of non-volatile storage elements, and one or more circuits for operating the set of non-volatile storage elements as discussed herein.

BRIEF DESCRIPTION OF THE DRAWINGS

FIG. 15 is a flow chart describing one embodiment of a process for reading pages of data in a block of non-volatile storage using flags.

DETAILED DESCRIPTION

Figure 1:
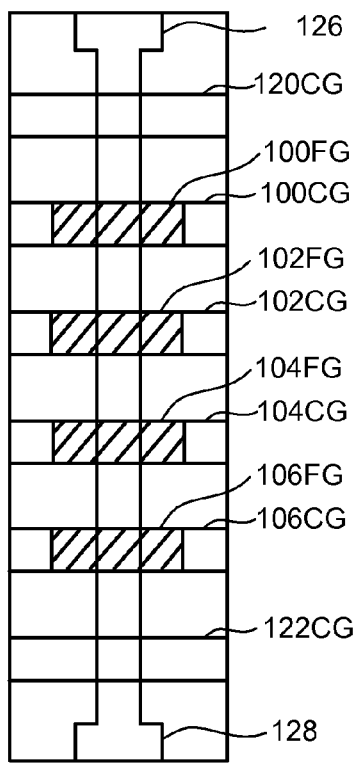
FIG. 1 is a top view of a NAND string.
Figure 2:
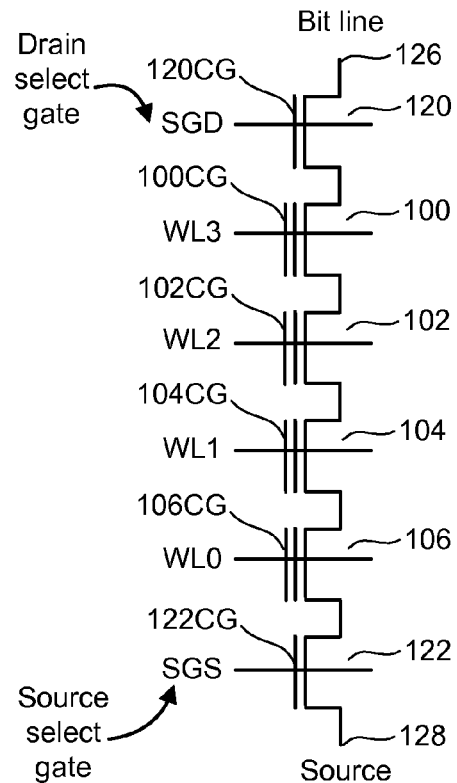
FIG. 2 is an equivalent circuit diagram of the NAND string of FIG. 1.

One example of a non-volatile memory system suitable for implementing the present invention uses a NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Specifically, transistors 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each storage elements, also referred to as cells or storage elements. In other designs, the storage elements may include multiple transistors or may be different than those depicted in FIGS. 1 and 2. Select gate 120 is connected to drain select line SGD, while select gate 122 is connected to source select line SGS.

Figure 3:
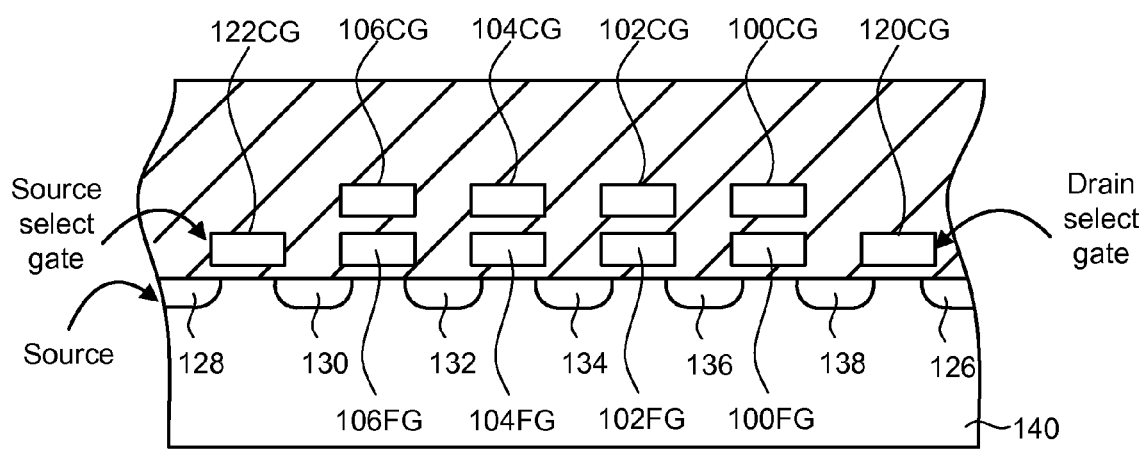
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the storage elements (100, 102, 104 and 106) form the word lines. N+ doped layers 130, 132, 134, 136 and 138 are shared between neighboring storage elements, whereby the storage elements are connected to one another in series to form the NAND string. These N+ doped layers form the source and drain of each of the storage elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

The use of four transistors in a NAND string in FIGS. 1-3 is provided only as an example, as a NAND string used with the technology described herein can have less than or more than four storage elements. For example, some NAND strings will include eight, sixteen, thirty-two, sixty-four or more storage elements.

The invention can be used with devices that are programmed and erased by Fowler-Nordheim tunneling, for instance. The invention is also applicable to devices that use a triple layer dielectric such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the storage element channel. The invention can also be applied to devices that use, for example, small islands of conducting materials such as nano crystals as charge storage regions instead of floating gates. Such memory devices can be programmed and erased in a similar way as floating gate based NAND flash devices.

Figure 4:
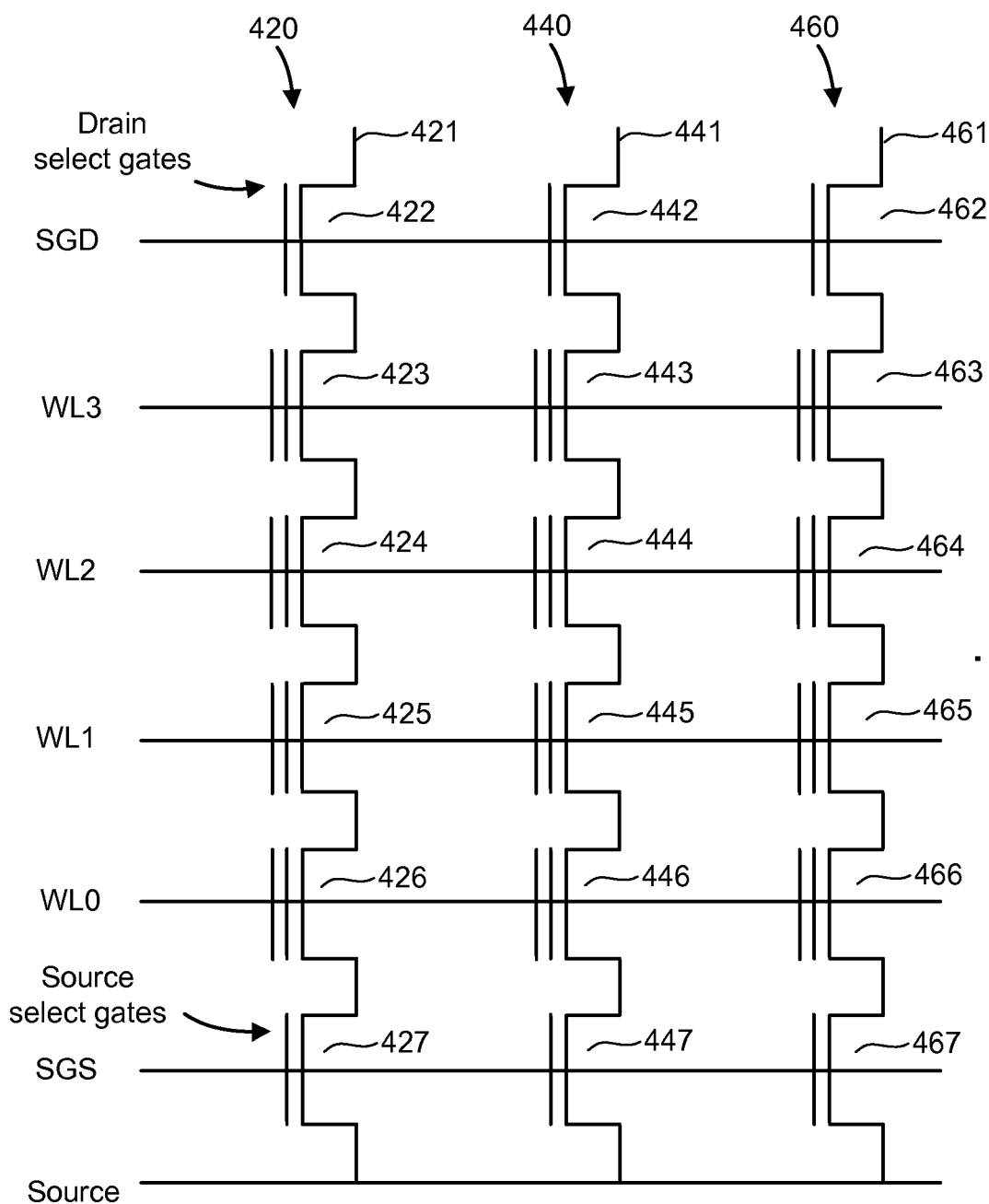
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 420, 440 and 460 are shown in a memory array having many more NAND strings. Each of the NAND strings includes two select transistors and four storage elements. For example, NAND string 420 includes select transistors 422 and 427, and storage elements 423-426, NAND string 440 includes select transistors 442 and 447, and storage elements 443-446, NAND string 460 includes select transistors 462 and 467, and storage elements 463-466. Each NAND string is connected to the source line by its select transistor (e.g., select transistor 427, 447 or 467). A selection line SGS is used to control the source side select gates. The various NAND strings 420, 440 and 460 are connected to respective bit lines 421, 441 and 461, by select transistors 422, 442, 462, etc., which are controlled by drain select line SGD. In other embodiments, the select lines do not necessarily need to be in common. Word line WL3 is connected to the control gates for storage elements 423, 443 and 463. Word line WL2 is connected to the control gates for storage elements 424, 444 and 464. Word line WL1 is connected to the control gates for storage elements 425, 445 and 465. Word line WL0 is connected to the control gates for storage elements 426, 446 and 466. As can be seen, each bit line and the respective NAND string comprise the columns of the array or set of storage elements. The word lines (WL3, WL2, WL1 and WL0) comprise the rows of the array or set. Each word line connects the control gates of each storage element in the row. For example, word line WL2 is connected to the control gates for storage elements 424, 444 and 464. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Publication 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, that word line is also connected to one storage element in each of the other NAND strings that share the same word line. For example, when programming storage element 424 of FIG. 4, the program voltage will also be applied to the control gates of storage elements 444 and 464.

However, shifts in the charged stored in a storage element can occur when programming and reading a given storage element and other storage elements which have some degree of coupling with the given storage element, such as those sharing the same word line or bit line. Specifically, shifts in the stored charge levels occur because of field coupling between storage elements. The problem is exacerbated as the spaces between storage elements are being decreased due to improvements in integrated circuit manufacturing techniques. The problem occurs most markedly between two groups of adjacent storage elements that have been programmed at different times. One group of storage elements is programmed to add a level of charge that corresponds to one set of data. After a second group of storage elements is programmed with a second set of data, the charge levels read from the first group of storage elements often appear to be different than what was programmed due to capacitive coupling of the charges of the second group of storage elements to the first group of storage elements. Thus, the effects of coupling depend on the order in which the storage elements are programmed and, therefore, the order in which the word lines are traversed during programming. A NAND string is typically, but not always, programmed from the source side to the drain side, starting at the source side word line and proceeding, one word line at a time, to the drain side word line.

Capacitive coupling effects on a given storage element can be caused by other storage elements in the same word line and in the same NAND string, for instance. For example, storage element 444 may be part of a first group of storage elements, which includes other alternating storage elements along word line WL2, which store a page of data. Storage elements 424 and 464 may be part of a second group of storage elements which store another page of data. When the second group of storage elements are programmed after storage element 444, there will be a capacitive coupling to storage element 444. The coupling is strongest from the direct neighboring storage elements on the word line, which are storage elements 424 and 464.

Similarly, storage element 444 can be affected by programming of storage elements which are on the same NAND string 440 if they are programmed after storage element 444. For storage element 444, the coupling is strongest from the direct neighboring storage elements on the NAND string, which are storage elements 443 and/or 445. For example, if storage elements in the NAND string 440 are programmed in the order: 446, 445, 444, 443, storage element 444 can be affected by coupling from storage element 443. Generally, storage elements which are arranged diagonally with respect to storage element 444, namely storage elements 423, 463, 425 and 465, can provide about 20% of the coupling for storage element 444, whereas the direct neighboring storage elements 424 and 464, and 443 and 445 on the same word line or NAND string provide about 80% of the coupling. The coupling may be enough to shift the $V_{TH}$ of a storage element by about 0.5 V in some cases, which is sufficient to cause a read error and to widen the $V_{TH}$ distribution of a group of storage elements.

Figure 5:
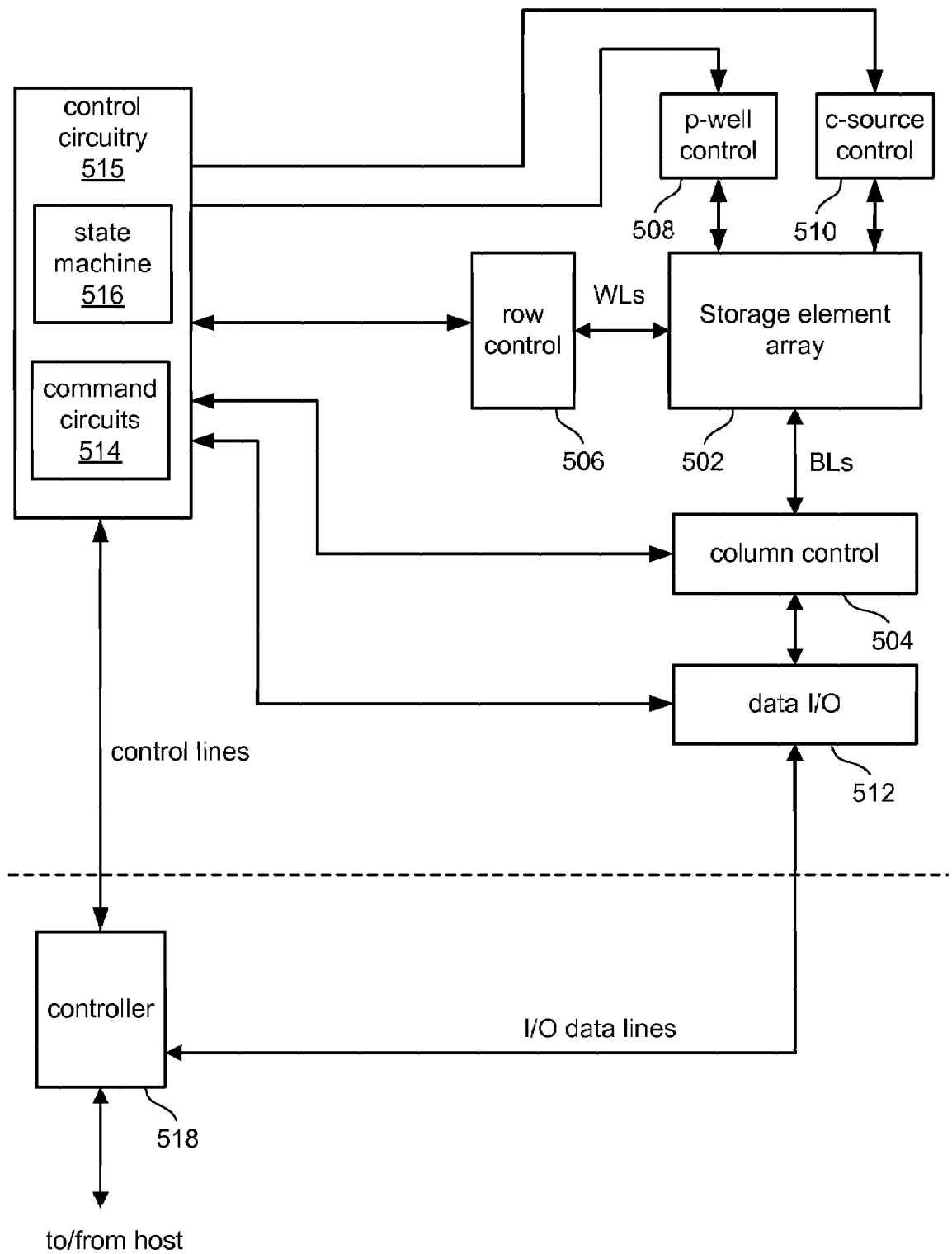
FIG. 5 is a block diagram of an example flash memory system that can be used to implement one or more embodiments of the present disclosure.

FIG. 5 is a block diagram of one embodiment of a flash memory system that can be used to implement one or more embodiments of the present disclosure. Other systems and implementations can be used as well. Storage element array 502 is controlled by column control circuit 504, row control circuit 506, c-source control circuit 510 and p-well control circuit 508. Column control circuit 504 is connected to the bit lines of storage element array 502 for reading data stored in the storage elements, for determining a state of the storage elements during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. C-source control circuit 510 controls a common source line (labeled as "c-source" in FIG. 5) connected to the storage elements. P-well control circuit 508 controls the p-well voltage.

The data stored in the storage elements is read out by the column control circuit 504 and output to external I/O lines via data input/output buffer 512. Program data to be stored in the storage elements are input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516 which is part of control circuitry 515. State machine 516 controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected to or connectable with a host system such as a personal computer, digital camera, personal digital assistant of the like. It communicates with the host that initiates commands, such as to store or read data to or from the memory array 502, and provides or receives such data. Controller 518 converts such commands into command signals that can be interpreted and executed by command circuits 514 which are part of control circuitry 515. Command circuits 514 are in communication with state machine 516. Controller 518 typically contains buffer memory for the user data being written to or read from the storage element array 502.

One exemplary memory system includes one integrated circuit that includes controller 518, and one or more integrated circuit chips that each contains a memory array and associated control, input/output and state machine circuits. There is a trend to integrate the memory arrays and controller circuits of a system together on one or more integrated circuit chips. The memory system may be embedded as part of the host system, or may be included in a memory card or other package that is removably inserted into the host systems. Such a card may include the entire memory system, e.g., including the controller, or just the memory array(s) with associated peripheral circuits, with the controller or control function being embedded in the host. Thus, the controller can be embedded in the host or included within the removable memory system.

In some implementations, some of the components of FIG. 5 can be combined. Further, in various designs, one or more of the components of FIG. 5, other than the storage element array 502, can be thought of as a managing circuit. For example, one or more managing circuits may include any one of, or a combination of, control circuitry, a command circuit, a state machine, a row control circuit, a column control circuit, a well control circuit, a source control circuit and a data I/O circuit.

Figure 6:
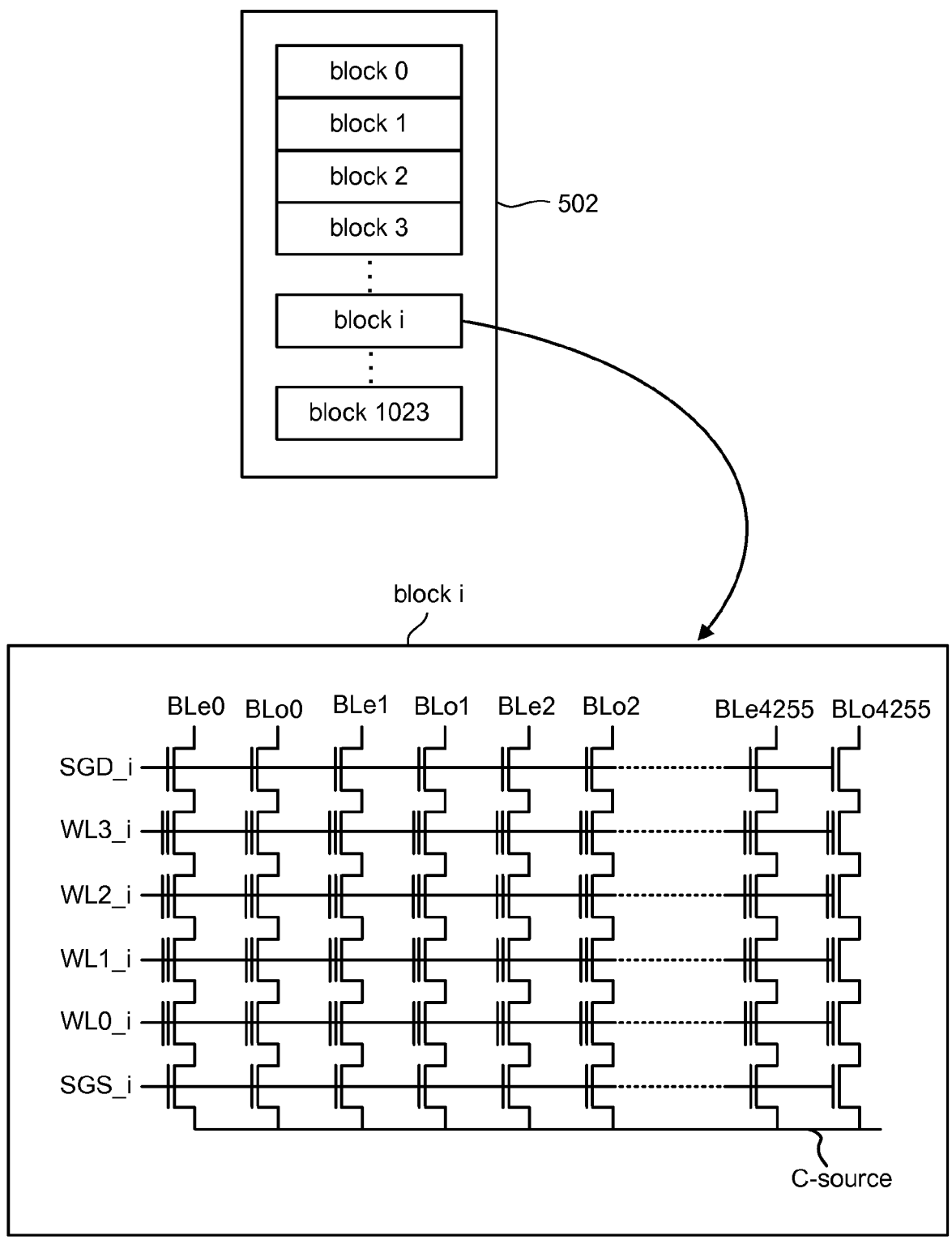
FIG. 6 illustrates an example of an organization of a memory array into blocks.

FIG. 6 provides an example structure of the storage element array 502 of FIG. 5. A NAND flash EEPROM is described that is partitioned into 1,024 blocks. Data can be programmed into different blocks and read from different blocks concurrently. In an erase operation, the data stored in each block is simultaneously erased. In one design, the block is the minimum unit of storage elements that are simultaneously erased. In each block, in this example, there are 8,512 columns that are divided into even columns and odd columns. The bit lines are also divided into even bit lines (BLe) and odd bit lines (BLo). Four storage elements are shown connected in series to form a NAND string. Although four storage elements are shown to be included in each NAND string, more or fewer than four storage elements can be used. Typically, up to 32 or 64 storage elements can be provided in each NAND string. One terminal of the NAND string is connected to a corresponding bit line via a select transistor SGD, and another terminal is connected to the c-source line via a second select transistor SGS.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used. Additionally, architectures other than those of FIGS. 5 and 6 can be used. For example, in one design, the bit lines are not divided into odd and even bit lines so that all bit lines can be programmed and read concurrently (or not concurrently).

Storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bitline. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of storage elements that are written at one time as a basic programming operation. One or more pages of data are typically stored in one row of storage elements. A page can store one or more sectors. A sector includes user data and overhead data, such as an Error Correcting Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16-20 bytes. A block can includes a number of pages, e.g., 8, 32, 64 or more pages.

Reprogramming

A programming technique is provided in which a set of storage elements is initially programmed and, subsequently, reprogrammed at least once. For example, the set may be a block of storage elements which can be erased as a unit. Or, the set can be associated with a set of word lines which is not necessarily erasable as a unit. In the initial programming, the set of storage elements is programmed. Furthermore, the storage elements can be programmed to different $V_{TH}$ levels in the initial programming and the reprogramming. Any programming technique can be used during the initial programming and reprogramming, including, but not limited to, those discussed below in connection with FIGS. 7A and B, FIG. 10 and FIGS. 11A-C. After the set of storage elements has been programmed in the initial programming, a reprogramming occurs in which the elements in the set are programmed to the desired final $V_{TH}$, for instance. The storage elements are not erased between the initial programming and reprogramming.

When reading the data from a storage element, in one approach, a first set of $V_{TH}$ read levels can be used for storage elements that have been programmed only once in the initial programming, while a second set of $V_{TH}$ read levels can be used for storage elements that have also been reprogrammed. The corresponding values of the second set can be higher than the first set. Alternatively, the same set of $V_{TH}$ read levels can be used in each case. Furthermore, the voltage margin between any two neighboring $V_{TH}$ states should be large enough to accommodate many parasitic phenomena including coupling, program disturb, read disturb, storage elements and system noise, overshoots, programming noise, and long term charge retention. Another parasitic phenomenon is a data pattern sensitivity effect, which relates to the effect of the specific data values, e.g., $V_{TH}$ values, of previously programmed storage elements. Reprogramming can allow reduced margins between neighboring $V_{TH}$ states because at least the coupling and overshoots will be reduced, and those pages that are not yet reprogrammed will be reprogrammed soon, so that no extra margin has to be devoted to long term retention issues for non-programmed pages. Furthermore, reprogrammed pages provide tighter $V_{TH}$ distributions, which open up the margins for such pages. The net effect is that the memory $V_{TH}$ window can be reduced, thereby allowing smaller programming voltages and reducing program disturb.

Figure 7A:
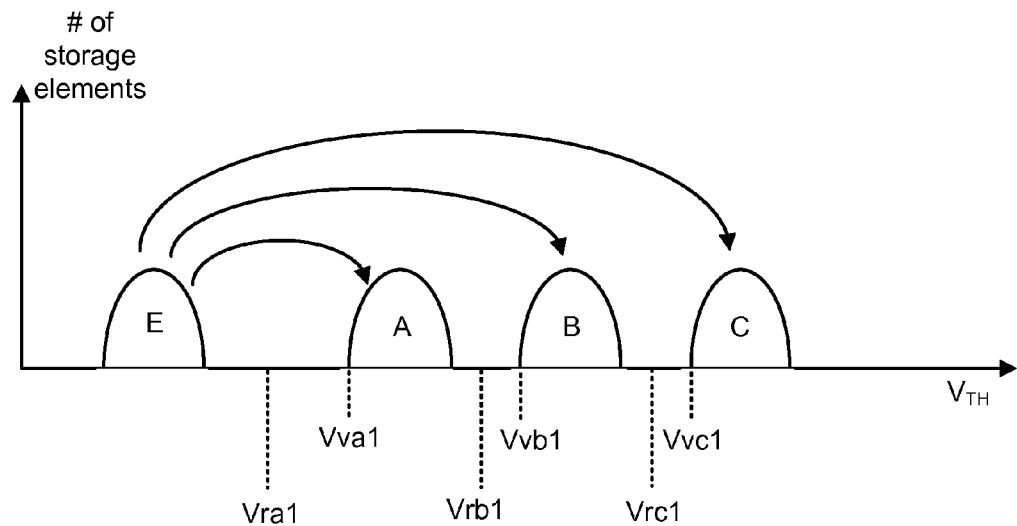
FIG. 7A depicts an example set of threshold voltage distributions in a multi-state device with direct programming from the erased state to a programmed state.

FIG. 7A depicts an example set of $V_{TH}$ distributions in a multi-state device with direct programming from the erased state to a programmed state. In this case, each storage element stores two bits of data in four data states represented by E, A, B and C. E depicts a first $V_{TH}$ distribution for erased storage elements, while A, B and C depict three $V_{TH}$ distributions for programmed storage elements. In one design, the $V_{TH}$ values in the E distribution are negative and the $V_{TH}$ values in the A, B and C distributions are positive. Each distinct $V_{TH}$ range corresponds to predetermined values for the set of data bits. The specific relationship between the data programmed into the storage element and the $V_{TH}$ levels of the storage element depends upon the data encoding scheme adopted for the storage elements. One example assigns "11" to the $V_{TH}$ range E (state E), "10" to the $V_{TH}$ range A (state A), "00" to the $V_{TH}$ range B (state B) and "01" to the $V_{TH}$ range C (state C). However, in other designs, other schemes are used.

A set of three read reference voltages, Vra1, Vrb1 and Vrc1, is used for reading data from storage elements after the initial programming. By testing whether the $V_{TH}$ of a given storage element is above or below Vra1, Vrb1 and Vrc1, the system can determine the state of the storage element. A set of three verify reference threshold voltages, Vva1, Vvb1 and Vvc1, which is used during the initial programming, is also indicated. When programming storage elements to state A, B or C, the system will test whether those storage elements have a $V_{TH}$ greater than or equal to Vva1, Vvb1 or Vvc1, respectively.

In one approach, known as full sequence programming, storage elements can be programmed from the erase state E directly to any of the programmed states A, B or C, as depicted by the curved arrows. For example, a population of storage elements to be programmed, such as a block, may first be erased so that all storage elements in the population are in the erased state E. While some storage elements are being programmed from state E to state A, other storage elements are being programmed from state E to state B and/or from state E to state C.

As mentioned, coupling and other effects tend to raise the $V_{TH}$ of a given storage element, thereby raising and widening the $V_{TH}$ distribution of a set of storage elements in a block, for instance. This can be seen by the relatively wide $V_{TH}$ distributions of FIG. 7A in comparison to those of FIG. 7B.

Figure 7B:
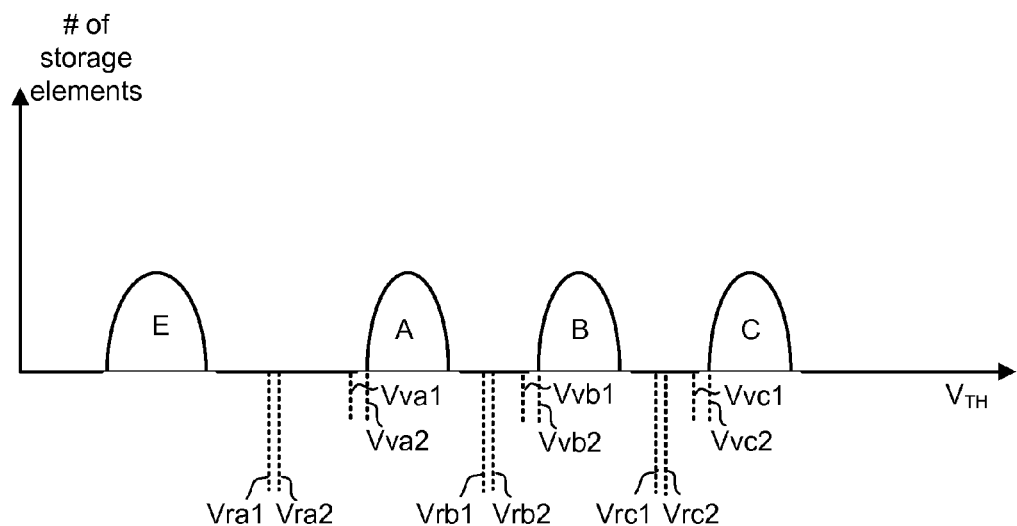
FIG. 7B depicts the example set of threshold voltage distributions of FIG. 7A after reprogramming.

FIG. 7B depicts the example set of $V_{TH}$ distributions of FIG. 7A after reprogramming. During the reprogramming, a second set of $V_{TH}$ verify levels, Vva2, Vvb2 and Vvc2 can be used which are incrementally higher than Vva1, Vvb1 and Vvc1, respectively, e.g., by 0.4 V. The offset in each state's verify voltage between the initial programming and reprogramming can be determined through memory characterization. For example, the offset can be about half of the threshold voltage distribution of each state. Therefore, if the threshold voltage distribution of state "A" is typically 0.8 V wide, then a 0.4 V offset may be used. Accordingly, if Vva1 is 0.6 V, then Vva2 can be 1.0 V. The increment between verify levels need not be the same for each state. After the reprogramming, the lower end of the $V_{TH}$ distributions for each state is moved up based on the incrementally higher threshold voltage verify levels, so that the $V_{TH}$ distributions are tightened. Thus, a set of storage elements can be programmed initially, and, after the initial programming is complete, the set of storage elements can be reprogrammed, to achieve the tightened $V_{TH}$ distributions of FIG. 7B.

In particular, the reprogramming reduces the coupling-induced spread of $V_{TH}$ values for each state because a smaller amount of charge is added to the storage elements compared to the amount added during initial programming. Moreover, if, because of coupling, a storage element's $V_{TH}$ is now higher than when it was originally programmed and locked out during the initial programming, it will require less programming during the reprogramming before being locked out. Also, the neighbors of a given storage element will not experience a significant coupling-induced shift in their $V_{TH}$ values during the reprogramming. As a result, the storage elements can be more accurately programmed to the desired final $V_{TH}$ in the reprogramming. The reprogramming mitigates all types of coupling effects, whether caused by word line-to-word line coupling, bit line-to-bit line coupling, or coupling from diagonally neighboring storage elements. Furthermore, if a storage element has been over-programmed due to inconsistencies in programming behavior, or due to noise associated with the last verify operation, it will require fewer programming pulses during the reprogramming to reach the desired final state. The reprogramming will only place a small amount of charge in each storage element that is being programmed. Since the $V_{TH}$ change during reprogramming is small, the lock out event will typically occur earlier and at a lower control gate program pulse voltage than during the initial programming. The benefits of reprogramming can be further understood with reference to FIGS. 8 and 9.

Figure 8:
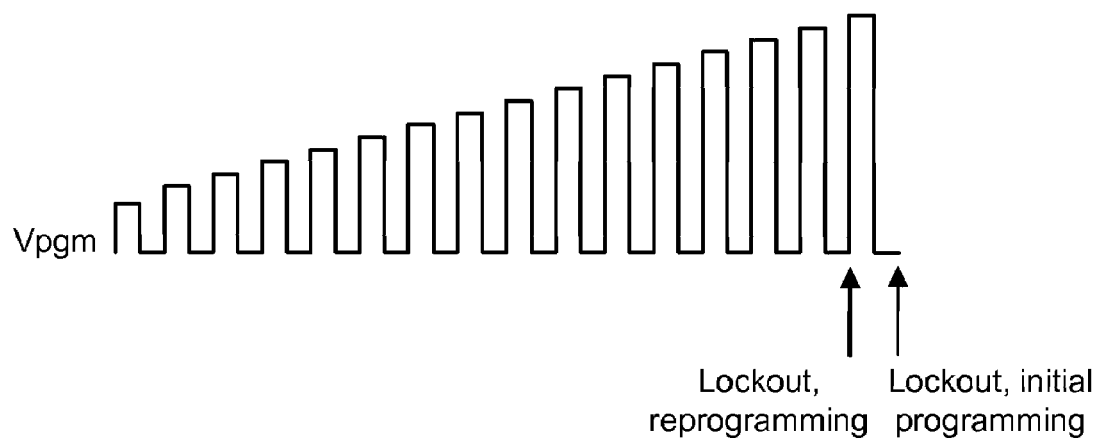
FIG. 8 depicts a series of programming pulses for programming non-volatile storage.
Figure 9:
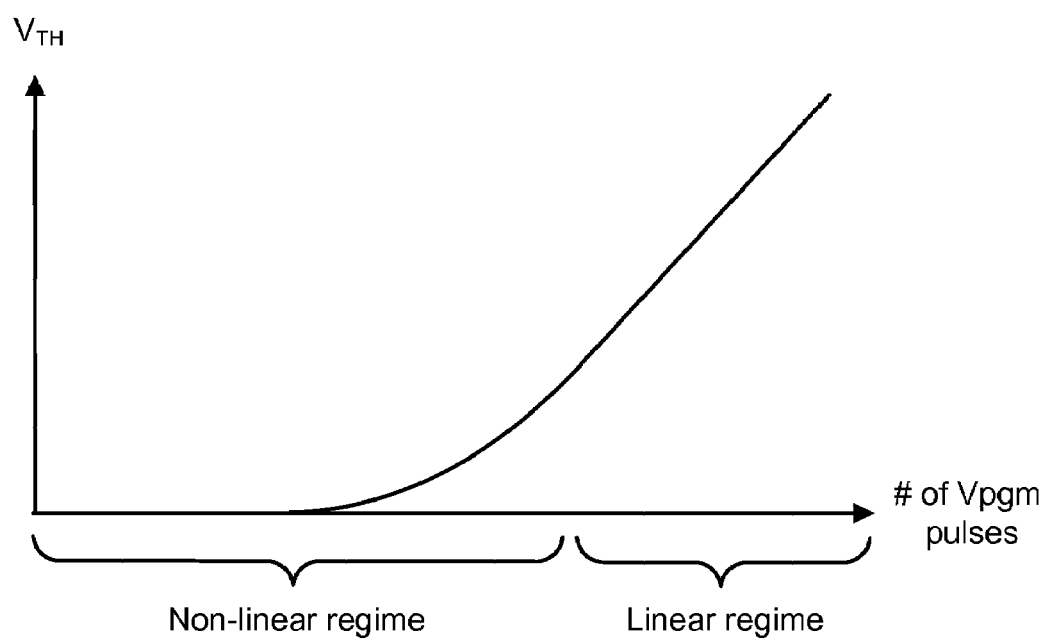
FIG. 9 depicts linear and non-linear programming regimes of a non-volatile storage element.

FIG. 8 depicts a series of programming pulses for programming non-volatile storage. In a common programming approach, a program voltage Vpgm is applied to the control gate of a storage element in a series of pulses. In one possible approach, the magnitude of the pulses is increased with each successive pulse by a predetermined step size, e.g., 0.4 V. Vpgm can be applied to the control gates (or, in some cases, steering gates) of flash memory elements. Vpgm is provided as a series of pulses that increase in magnitude over time. In the periods between the program pulses, verify operations are carried out. That is, the programming level of each storage element of a set of storage elements being programmed in parallel, such as particular storage elements on a word line, is read between successive programming pulses to determine whether it is equal to or greater than a verify level to which the storage element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

If a storage element does not reach the desired program level after a given number of pulses, which is conventionally fixed, an error condition is declared. The choice of the magnitude of Vpgm, including an initial value, the voltage step size, if applicable, and the maximum number of pulses to apply before declaring an error condition, involves a compromise among various factors. In particular, if the initial value or the step size is too large, some memory elements may be over-programmed, resulting in an inaccurate $V_{TH}$, while longer programming times will result if the initial value or the step size is too small. Typically, users of non-volatile memory desire that the memory program quickly. Furthermore, the number of pulses needed to program different memory elements to a desired state can differ. Slower memory elements will need more pulses while faster memory elements will need fewer pulses. In order to have a sufficient margin or cushion so that the die-sort yield is acceptable, a relatively large number of Vpgm pulses is typically allowed. For example, in 90 nm devices, although most upper pages in multi-state memory element devices can be programmed within eighteen pulses, the maximum allowed number of pulses may be set at, e.g., twenty-four, to provide a margin of six pulses.

For example, assume that, in the initial programming, a given storage element reaches the verify level and is locked out from receiving further Vpgm pulses at the 16$^{th}$ program pulse, as indicated. The change in the threshold voltage ($\Delta V_{TH}$) of the storage element with each Vpgm pulse can be understood with reference to FIG. 9, which depicts linear and non-linear programming regimes of an average non-volatile storage element. During the initial Vpgm pulses, the storage element is in a non-linear regime in which the increase in $V_{TH}$ is non-linear with respect to the number of programming pulses. Essentially, the voltage which is applied to the control gate is not sufficient to allow tunneling to occur. As additional Vpgm pulses are applied, $\Delta V_{TH}$ increases slowly until it reaches a linear programming regime in which $\Delta V_{TH}$ becomes approximately constant with subsequent Vpgm pulses. In this regime, a 1 V increase in Vpgm theoretically results in a 1 V increase in $V_{TH}$. Programming noise and read noise tend to randomize the amount of the increase in $V_{TH}$. Also, depletion effects tend to reduce the $\Delta V_{TH}$ in the linear regime to a value less than 1 V per 1 V increase in Vpgm. For example, in linear regime, $\Delta V_{TH}/\Delta V\text{pgm}$ can be close to 0.8. Nevertheless, once in the linear regime, the storage element quickly reaches the lockout $V_{TH}$ (verify level) with each additional Vpgm pulse during the initial programming. Faster programming storage elements will reach the linear regime sooner than slower programming storage elements. Depending on the value of the starting Vpgm, some very fast storage elements may program at a much faster rate for the first few Vpgm pulses until they slow down to approach the linear regime. It may be desirable for the starting Vpgm to be set low enough to avoid this.

During the reprogramming, the $V_{TH}$ of the storage element only needs to increase by a relatively small value, such as 0.4 V. Typically, the storage element will be in the non-linear regime during the reprogramming. In most cases, it is expected that one or more fewer programming pulses will be needed to reach the higher lockout $V_{TH}$ in the reprogramming than in the initial programming. In the example provided, the storage element reaches the lockout $V_{TH}$ during the reprogramming at the 15$^{th}$ Vpgm pulse, one pulse sooner than in the initial programming.

For instance, in the present example, assume $V_{TH}$ changes with Vpgm as indicated in Tables 1 and 2 during the initial programming and reprogramming, respectively. The storage element is being programmed from state E, which has a $V_{TH}$ of −2 V, to state A, which has a lockout $V_{TH}$ (Vva1, FIG. 7A) of 1.1 V for the initial programming, and a lockout $V_{TH}$ (Vva2, FIG. 7B) of 1.3 V for the reprogramming. The step size of Vpgm is 1.0 V in this example for simplicity. As can be seen, the storage element is locked out in the initial programming after the 16$^{th}$ pulse, when its $V_{TH}$ first exceeds 1.1 V. The storage element is locked out in the reprogramming after the 15$^{th}$ pulse, when its $V_{TH}$ first exceeds 1.3 V.

TABLE 1

| Vpgm pulse #: | $V_{TH}$ (V): | $\Delta V_{TH}$ (V), pulse-to-pulse: |
|---|---|---|
| 1-12 | −2 | 0 |
| 13 | −1.5 | 0.5 |
| 14 | −0.75 | 0.75 |
| 15 | 0.25 | 1.0 |
| 16 | 1.25 | 1.0 |

TABLE 2

| Vpgm pulse #: | $V_{TH}$ (V): | $\Delta V_{TH}$ (V), pulse-to-pulse: |
|---|---|---|
| 1-14 | 1.25 | 0 |
| 15 | 1.35 | 0.1 |

Thus, while operating in the non-linear regime during the reprogramming, the effect is similar to using a smaller Vpgm step size, since $V_{TH}$ is nudged up to the desired value in smaller steps than in the initial programming. This avoids overshoots and allows finer control of the $V_{TH}$. As a result, a tighter and more accurate $V_{TH}$ distribution can be achieved.

Additional example programming techniques which may be used are discussed in connection with FIG. 10 and FIGS. 11A-C.

Figure 10:
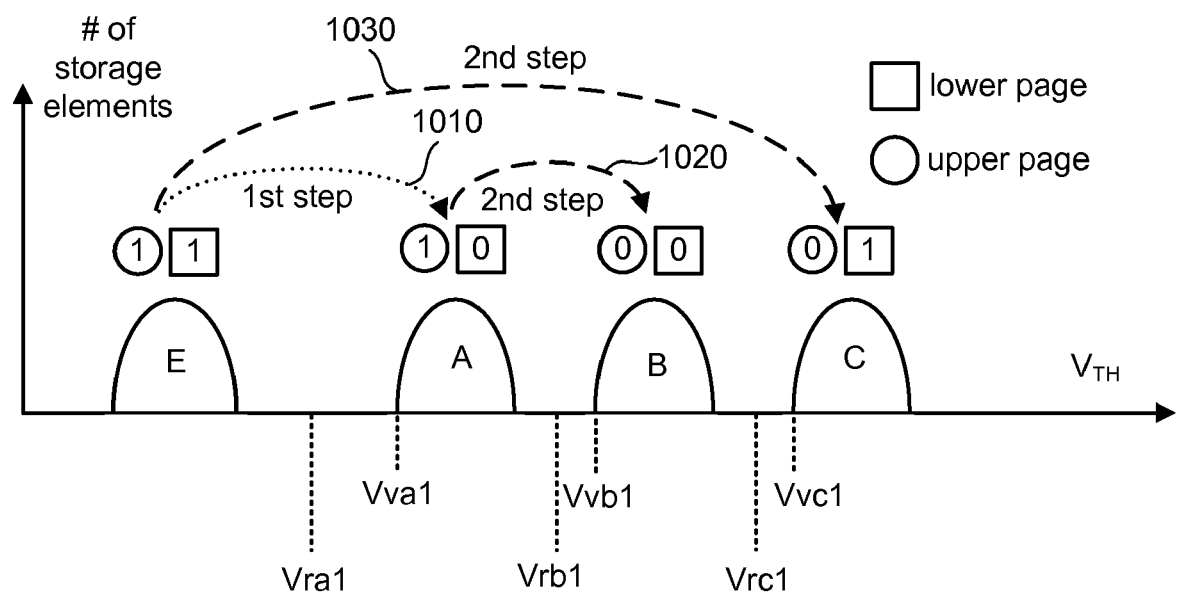
FIG. 10 depicts an example of a two-pass technique of programming a multi-state storage element that stores data for two different pages of data

FIG. 10 illustrates an example of a two-pass technique of programming a multi-state storage element that stores data for two different pages of data: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Although specific bit patterns have been assigned to each of the states, different bit patterns may also be assigned. In a first programming pass, the storage element's $V_{TH}$ level is set according to the bit to be programmed into the lower logical page. If that bit is a logic "1," the $V_{TH}$ is not changed since it is in the appropriate state as a result of having been previously erased. However, if the bit to be programmed is a logic "0," the threshold level of the storage element is increased to be state A, as shown by arrow 1010.

In a second pass, the storage element's $V_{TH}$ level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the $V_{TH}$ is shifted. If the first step resulted in the storage element remaining in the erased state E, then, in the second phase, the storage element is programmed so that the $V_{TH}$ is increased to be within state C, as depicted by arrow 1030. If the storage element had been programmed into state A as a result of the first programming pass, then the storage element is further programmed in the second step so that the $V_{TH}$ is increased to be within state B, as depicted by arrow 1020. The result of the second pass is to program the storage element into the state designated to store a logic "0" for the upper page without changing the data for the lower page. Both passes occur in both the initial programming and the reprogramming.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's storage elements. More details of such an approach are disclosed in U.S. patent application Ser. No. 11/013,125, titled "Pipelined Programming of Non-Volatile Memories Using Early Data," filed on Dec. 14, 2004 by inventors Sergy A. Gorobets and Yan Li, and incorporated herein by reference in its entirety.

Once the initial programming has been completed, the relatively wide $V_{TH}$ distribution of FIG. 10 is similar to that of FIG. 7A. Subsequently, the reprogramming can be performed, thereby tightening the relatively wide $V_{TH}$ distribution of FIG. 10 to a $V_{TH}$ distribution similar to that of FIG. 7B.

Figure 11A:
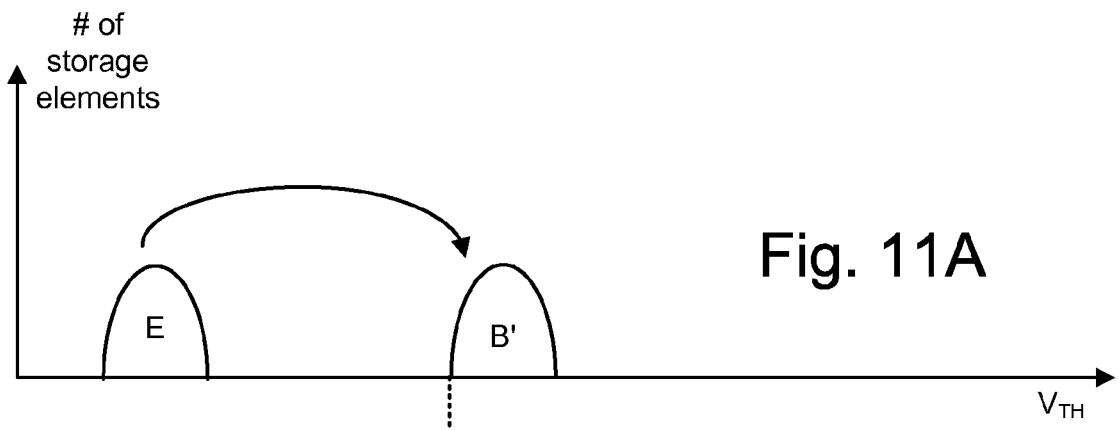
FIGS. 11A-11C depict an example set of threshold voltage distributions in a multi-state device with two-step programming from the erased state to an intermediate state in a first step, and from the erased state to a first state "A", and from the intermediate state to a second state "B" or a third state "C", in a second step.
Figure 11B:
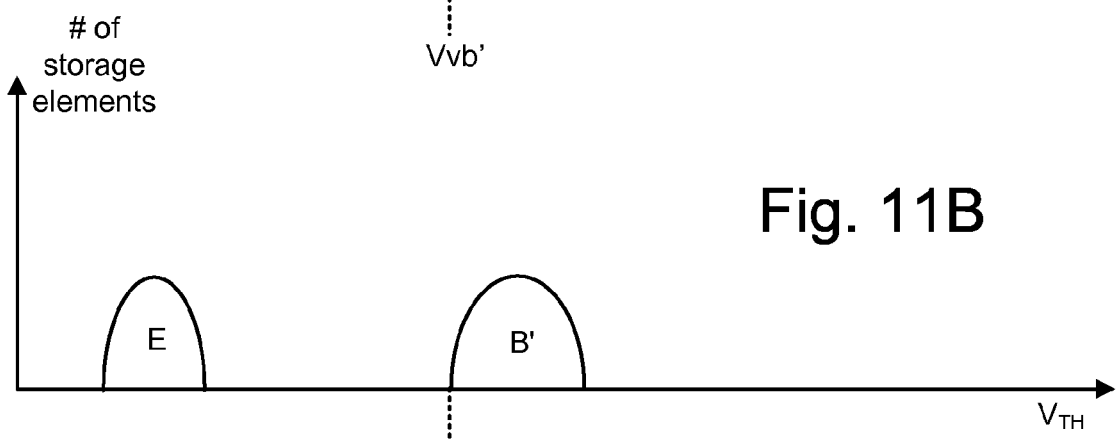
Figure 11C:
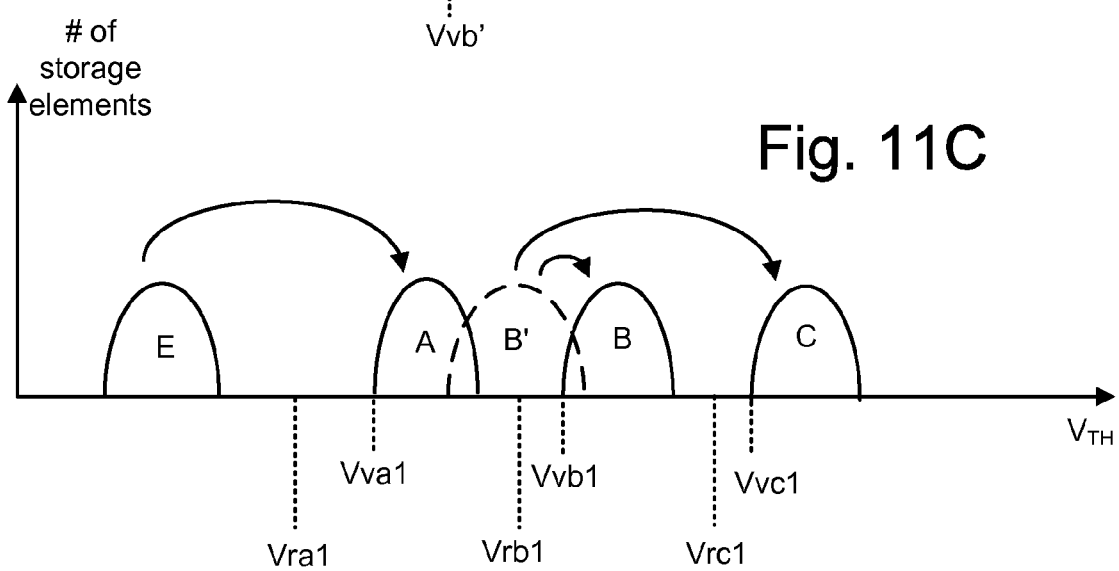

FIGS. 11A-C depict another process for programming non-volatile memory that reduces floating gate-to-floating gate coupling by, for any particular storage element, writing to that particular storage element with respect to a particular page subsequent to writing to adjacent storage elements for previous pages. The process shown is performed for both the initial programming and reprogramming.

In one example implementation, each of the non-volatile storage elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each storage element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps which occur in both the initial programming and the reprogramming. In the first step, the lower page is programmed. If the lower page is to remain data 1, then the storage element state remains at state E. If the data is to be programmed to 0, then the $V_{TH}$ of the storage element is raised such that the storage element is programmed to state B'. FIG. 11A therefore shows the programming of storage elements from state E to state B', which represents an interim state B; therefore, the verify point is depicted as Vvb', which is lower than Vvb1, depicted in FIG. 11C.

In one design, after a storage element is programmed from state E to state B', its neighbor storage element on an adjacent word line is programmed with respect to its lower page. After programming the neighbor storage element, the floating gate-to-floating gate coupling effect will raise the apparent $V_{TH}$ of storage element under consideration, which is in state B'. This will have the effect of widening the $V_{TH}$ distribution for state B' to that depicted in FIG. 11B. This apparent widening of the $V_{TH}$ distribution will be remedied, at least in part, when programming the upper page.

FIG. 11C depicts the process of programming the upper page. If the storage element is in erased state E and the upper page is to remain at 1, then the storage element will remain in state E. If the storage element is in state E and its upper page data is to be programmed to 0, the $V_{TH}$ of the storage element will be raised so that the storage element is in state A. If the storage element is in state B' with the intermediate $V_{TH}$ distribution and the upper page data is to remain at 1, the storage element will be programmed to final state B. If the storage element is in state B' with the intermediate $V_{TH}$ distribution and the upper page data is to become data 0, the $V_{TH}$ of the storage element will be raised so that the storage element is in state C. The process depicted by FIGS. 11A-C reduces the effect of floating gate-to-floating gate coupling because only the upper page programming of neighbor storage elements will have an effect on the apparent $V_{TH}$ of a given storage element. An example of an alternate state coding is to move from the intermediate $V_{TH}$ distribution to state C when the upper page data is a 1, and to move to state B when the upper page data is a 0. Although FIGS. 11A-C provide an example with respect to four data states and two pages of data, the concepts taught can be applied to other implementations with more or fewer than four states and more or fewer than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

While the programming technique of FIGS. 11A-C reduces the effects of coupling, some coupling will still result due to the upper page programming of neighbor storage elements. Accordingly, the $V_{TH}$ distributions of FIG. 11C are still wider than necessary. To address this, once the initial programming has been completed, reprogramming can be performed, resulting in a tighter $V_{TH}$ distribution, similar to that of FIG. 7B.

Figure 12:
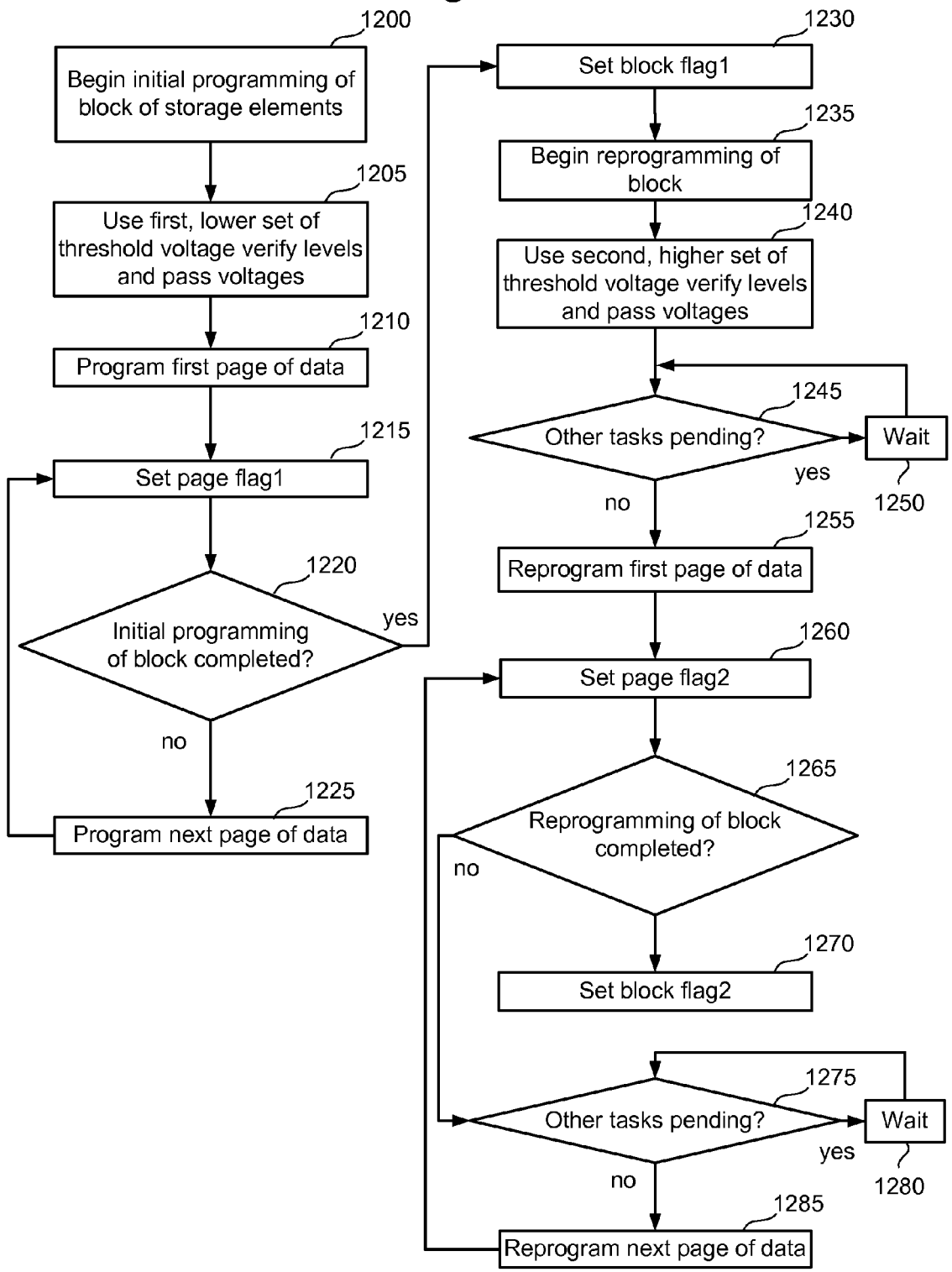
FIG. 12 is a flow chart describing one embodiment of a process for programming a block of non-volatile storage elements using initial programming and reprogramming.

FIG. 12 is a flow chart describing one embodiment of a process for programming a block of non-volatile storage elements using initial programming and reprogramming. While the process is described in terms of a block of storage elements, it is generally applicable to any set of storage elements. At step 1200, the initial programming for a block begins, such as in response to a command to store data. At step 1205, a first, lower set of threshold voltage ($V_{TH}$) verify levels, such as Vva1, Vvb1 and Vvc1 (FIG. 7A), are used, e.g., by loading them into a working memory of the control. Additionally, a first, lower pass voltage, Vpass1, is used. The use of different pass voltages during the initial programming and reprogramming is discussed further below in connection with FIGS. 14A-F. At step 1210, a first page of data in the block is programmed and, at step 1215, a flag bit (page flag1) is set for the page accordingly. Note that, in one approach, the page flag can be set during the programming of the first page of data at step 1210.

In one possible approach, information such as one more flags can be used to keep track of the programming status of portions of the block, such as pages. Such a flag is a form of programming status information. The programming status information can indicate whether a page has undergone programming and/or reprogramming so that the control can determine which pages need to be reprogrammed and which pages can be skipped. The flag should have a sufficient granularity to convey the desired information. For example, one bit per page is sufficient to indicate whether reprogramming has occurred for the page when there is only one reprogramming cycle. The flag can be stored in one of the storage elements of a word line in which the page is stored, for instance. The flag or flags for each page can be a bit or a set of bits.

Additionally, or alternatively, a flag at the block level can be provided to indicate whether the reprogramming has been completed for the block or other unit of storage elements as a whole. The block flag, in one approach, can be two bits, where one bit indicates whether or not an initial programming has been completed, and the other bit indicates whether or not a reprogramming has been completed. An additional bit can be used for each additional reprogramming, if more than one reprogramming is performed. A block flag may be used when the block flag is stored outside of the programmed block.

Generally, a block flag is not required as page flags of the first and last programmed pages in a block can be used to indicate whether a block has been programmed or reprogrammed. For example, a first bit of the first programmed page, and a corresponding first bit of the last programmed page, can indicate whether or not the initial programming has occurred. If the bit of the first programmed page indicates that initial programming has not been performed for the first programmed page, it can be concluded that initial programming has not been performed for any portion of the block. If the bits indicate that initial programming has been performed for the first programmed page but not the last page, it can be concluded that initial programming has been performed for a portion of the block. If the bit of the last programmed page indicates that initial programming has been performed for the last page, it can be concluded that initial programming has been performed for the entire block.

Similarly, a second bit of the first programmed page, and a corresponding second bit of the last programmed page, can indicate whether or not the reprogramming has occurred. If the bit of the first programmed page indicates that reprogramming has not been performed for the first programmed page, it can be concluded that reprogramming has not been performed for any portion of the block. If the bits indicate that reprogramming has been performed for the first programmed page but not the last programmed page, it can be concluded that reprogramming has been performed for a portion of the block. If the bit of the last programmed page indicates that reprogramming has been performed for the last programmed page, it can be concluded that reprogramming has been performed for the entire block.

When the entire block has not yet been reprogrammed, the lower read voltages are used, while for the case where the entire block has been reprogrammed, the higher read voltages are used. When a block is partially reprogrammed, the control may perform a binary read of the flag storage element(s) that have been binary encoded to determine the proper word line read voltages with which to read the page. In one approach, the lower read voltages are used for a page which has not been reprogrammed, while the higher read voltages are used for a page which has been reprogrammed.

Each of the different states of a single multi-level storage element may be used for storing programming status information so that multiple flag values can be designated. Or, the block flag can use a single bit which indicates whether or not the block has been reprogrammed. Generally, the block flags can be encoded in binary or multi-level storage elements and reside within the same block, e.g., in the first page of the block, or in another block or location. For multi-level storage elements, the flag bits may use states E and C, for instance, which are the furthest apart states, to provide greater reliability, in one possible approach.

Thus, at step 1215, a page flag (page flag1) is set for the currently programmed page to indicate its programming status. Setting the page flag includes leaving the flag in its existing state if the programming status information identified by that state is correct. For example, a one bit may indicate that the page has not been reprogrammed. After the initial programming, the bit will be left in this state. After the reprogramming, the bit is changed to a value of zero.

At decision step 1220, a determination is made as to whether the initial programming has been completed for the block. This can be determined, for example, by determining when the storage elements on a last word line in a block, such as the drain side word line in a bock of NAND strings, have been programmed. If the initial programming is not yet complete, the next page of data is programmed at step 1225, and a page flag (page flag1) is set for that next page at step 1215 indicating that only the initial programming has been performed; that is, the reprogramming has not yet been performed. Each successive page is programmed until the initial programming has been completed for the block, at which time a block flag (block flag1) can be set for the block at step 1230, in one approach, and, at step 1235, the reprogramming begins. Such a block flag is a form of programming status information. Alternatively, a block flag need not be used as discussed previously. Note that, in one approach, the block flag can be set during the programming of the last page of data (step 1225). At step 1240, a second, higher set of threshold voltage ($V_{TH}$) verify levels, such as Vva2, Vvb2 and Vvc2 (FIG. 7B), is used. Additionally, a second, higher pass voltage, Vpass2, or set of pass voltages, is used.

At decision step 1245, a decision is made as to whether other tasks are pending. If there are other tasks pending, a wait is initiated at step 1250 until there are no other tasks pending. Generally, to avoid a performance penalty, the reprogramming can occur on a non-real time basis when at least one circuit which manages programming of the block, such as the control circuitry 515 of FIG. 5, has entered a standby mode and has no other tasks pending, or at least no other higher priority tasks pending. That is, the reprogramming does not have to immediately follow the initial programming, and, once started, it does not have to proceed without stopping in reprogramming all storage elements. For example, the integer number of pages of data, e.g., one or more pages, can be reprogrammed at a time before temporarily stopping and restarting later in reprogramming the next page of data. The stopping and restarting can occur a number of times before the block has completed reprogrammed. Thus, the reprogramming can be performed at different times after at least one circuit which manages programming of the block or other unit of non-volatile storage elements enters a standby mode, and/or when there is no other task of higher priority pending. Alternatively, the reprogramming can occur on a real time basis, directly following the initial programming and/or proceeding continuously from start to finish.

Specifically, the reprogramming may occur when there is no other request pending to read or write data, or there is no other task of higher priority pending, such as tasks involving garbage collecting or defragmenting. The reprogramming can therefore occur as a background process which is run when resources are available, starting and stopping as resources permit. For example, consider a non-volatile storage in a digital camera. When a user takes a picture, the controller will be busy storing the image data in at least a first block of non-volatile storage in the initial programming, after which there is typically wait time before the user decides to take another picture. The reprogramming can be performed in this wait time. If the user takes another picture before the reprogramming is completed, the reprogramming can be temporarily suspended to allow the new image data to be written in the initial programming of a second block, for instance. Once this is completed, the reprogramming of the first block can be resumed. Subsequently, the reprogramming of the second block can be initiated. Reprogramming can also occur in parallel for more than one block. Similarly, if the user turns the power to the camera off, the reprogramming can be temporarily suspended until the camera is powered back on and is not busy with another task.

Figure 13:
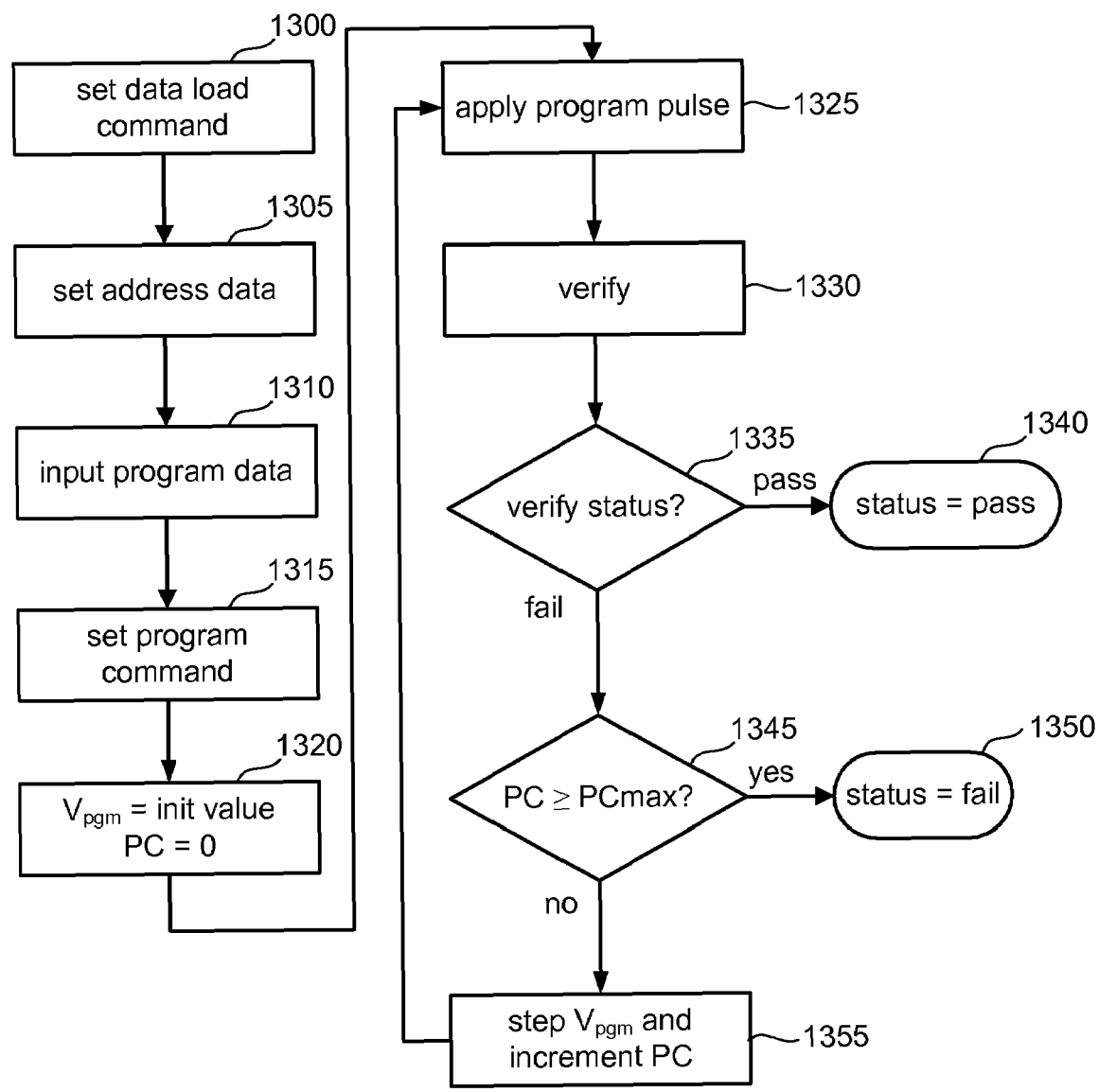
FIG. 13 is a flow chart describing one embodiment of a process for programming non-volatile storage using a series of programming pulses.

At step 1255, a first page of data is reprogrammed using the new $V_{TH}$ verify levels and pass voltages and, at step 1260, a page flag (page flag2) is set for the page, e.g., to indicate that reprogramming has occurred for the page. The page flag is a form of programming status information. Note that, in one approach, the page flag can be set during the programming of a page of data at step 1255. At decision step 1265, if the reprogramming has completed for the block, a block flag (block flag2) can be set for the block at step 1270, in one approach, and reprogramming is complete. The block flag is a form of programming status information. Alternatively, a block flag need not be used as discussed previously. Note that, in one approach, the block flag can be set during the programming of a page of data. Otherwise, the next page of data is reprogrammed, at step 1285, unless other tasks are pending, at decision step 1275, in which case a wait is implemented, at step 1280. Each successive page in the block is reprogrammed and has a page flag set at step 1260 until the reprogramming of the block is complete. Generally, the reprogramming can be suspended and restarted on page boundaries. If the user attempts to shut down the device when it is in the middle of programming a page, the shut down will be deferred until programming of the current page is complete. In practice, this time period is a fraction of a second and is therefore not apparent to the user. FIG. 13 is a flow chart describing one embodiment of a process for programming non-volatile storage using a series of programming pulses. The process may be used for programming a page of data, for instance, as indicated at steps 1210, 1225, 1255 and 1285 of FIG. 12. The erase process is typically carried out on multiple word lines at the same time, such as a block, while programming is done on a word line-by-word line basis. Referring also to FIG. 5, at step 1300, a "data load" command is issued by the control circuitry 515 and input to command circuits 514, allowing data to be input to data input/output buffer 512. The input data is recognized as a command and latched by state machine 516 via a command latch signal input to command circuits 514. At step 1305, address data designating the page address is input to row controller or decoder 506 from the controller or host. The input data is recognized as the page address and latched via state machine 516, affected by the address latch signal input to command circuits 514. At step 1310, a page of program data for the addressed page is input to data input/output buffer 512 for programming. For example, 532 bytes of data could be input in one embodiment. That data is latched in the appropriate registers for the selected bit lines. In some embodiments, the data is also latched in a second register for the selected bit lines to be used for verify operations. At step 1315, a "program" command is issued by the controller and input to data input/output buffer 512. The command is latched by state machine 516 via the command latch signal input to command circuits 514.

Triggered by the "program" command, the data latched in step 1315 will be programmed into the selected storage elements controlled by state machine 516 using stepped pulses applied to the appropriate word line, as shown in FIG. 8. At step 1320, Vpgm, the programming pulse voltage level applied to the selected word line, is initialized to the starting pulse (e.g., 12 V) and a program counter PC maintained by state machine 516 is initialized at 0. The magnitude of the initial program pulse can be set, e.g., by properly programming a charge pump. At step 1325, the first Vpgm pulse is applied to the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{DD}$ to inhibit programming.

At step 1330, the states of the selected storage elements are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 1335, it is checked whether all of the data latches are storing logic "1." If so, the programming process is complete and successful because all selected storage elements were programmed and verified to their target states. A status of "PASS" is reported at step 1340. A pass can also be reported if a predetermined portion of the storage elements were programmed and verified.

Optionally, a pass can be declared at step 1335 even when some of the memory elements have not yet reached their desired state. Thus, even if a certain number of cells can not reach the desired state, programming can stop before the maximum number of loops is reached.

If, at step 1335, it is determined that not all of the data latches are storing logic "1," then the programming process continues. At step 1345, the program counter PC is checked against a program limit value PCmax. One example of a program limit value is twenty pulses, however, other values can be used in various implementations. If the program counter PC has reached PCmax, the program process is flagged as failed and a status of fail is reported at step 1350. For example, a fail status may occur when the number of unsuccessfully programmed bits is greater than a predetermined number. If the program counter PC is less than PCmax, then the Vpgm level is increased by the step size and the program counter PC is incremented at step 1355. The process then loops back to step 1325 to apply the next Vpgm pulse.

The flowchart depicts a programming method that can be used for binary storage elements. For multi-level storage, for example, multiple programming or verification steps, such as discussed in connection with FIG. 10 and FIGS. 11A-C, may be used in a single iteration of the flowchart. Steps 1320-1355 may be performed for each step of the programming operation. In a first step, one or more program pulses may be applied and the results thereof verified to determine if a cell is in the appropriate intermediate state. In a second step, one or more program pulses may be applied and the results thereof verified to determine if the cell is in the appropriate final state. At the end of a successful program process, the threshold voltages of the storage elements should be within one or more distributions of threshold voltages for programmed storage elements or within a distribution of threshold voltages for erased storage elements.

Boosting Techniques

FIGS. 14A-F depict boosting techniques which use different pass voltages for initial programming and reprogramming. These techniques involve applying a pass voltage, Vpass, to the unselected word lines during programming. Generally, during reprogramming, it can be helpful to increase the pass voltage, Vpass2, relative to the pass voltage, Vpass1, used for the initial programming, because, during the reprogramming, the storage elements residing under the drain side word lines are no longer erased. As a result, more of the Vpass boosting potential has to be expended on reaching an inversion condition for these storage elements that may now be programmed to high threshold voltages. The elevated Vpass voltages may result in inadvertent programming of erased storage elements under non-selected word lines, in a process known as off-row-disturb. However, if the storage element $V_{TH}$ window is reduced because of the advantages of block reprogramming, this may offset the effect of higher Vpass voltages. For example, Vpass2 may exceed Vpass 1 by 0.5 V. In one possible implementation, Vpass2 may be 7-10 V while Vpass1 may be 6.5-9.5 V. Generally, the same or different Vpass values can be applied to different word lines. For example, the Vpass applied to an unselected word line can be a function of a position of the unselected word line with respect to a selected word line and/or with respect to the boundaries of a block, in addition to being a function of whether initial or reprogramming is performed.

Figure 14A:
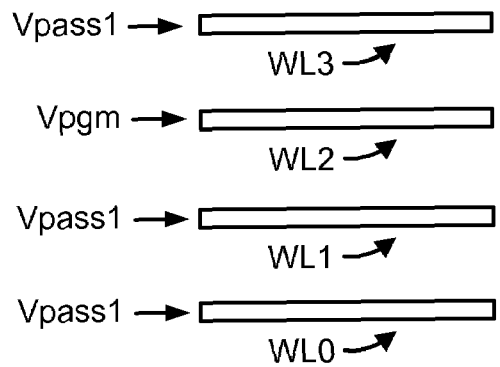
FIGS. 14A-F depict boosting techniques which use different pass voltages for initial programming and reprogramming.
Figure 14B:
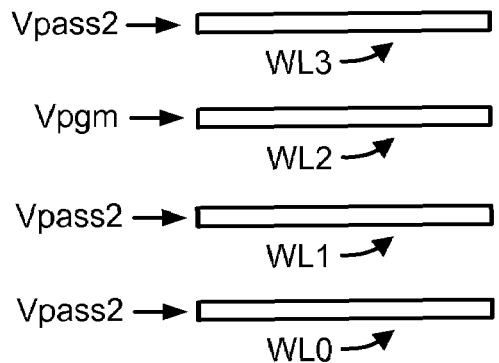

FIGS. 14A and 14B thus show the voltages which are applied to the word lines for the initial programming and reprogramming, respectively, for a self-boosting technique. With self boosting, the channels associated with the unselected bit lines are electrically isolated, and the pass voltage, Vpass1 or Vpass2, is applied to the unselected word lines during programming. The unselected word lines couple to the channels associated with the unselected bit lines, causing a voltage (e.g., 7.5 or 8 V during initial programming and reprogramming, respectively) to exist in the channel of the unselected bit lines. Thus, self boosting causes a voltage boost to exist in the channel which tends to lower the voltage across the tunnel oxide and hence reduce program disturb. For example, assume there are four word lines WL0-WL3, in a simplified example, and that storage elements on WL2 are currently being programmed by the programming voltage Vpgm. In this case, self boosting is achieved by applying Vpass1 or Vpass2 to WL0, WL1 and WL3. In practice, the voltages may be applied to opposite ends of alternate word lines.

Figure 14C:
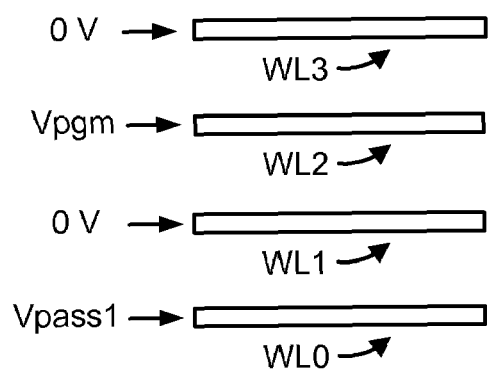
Figure 14D:
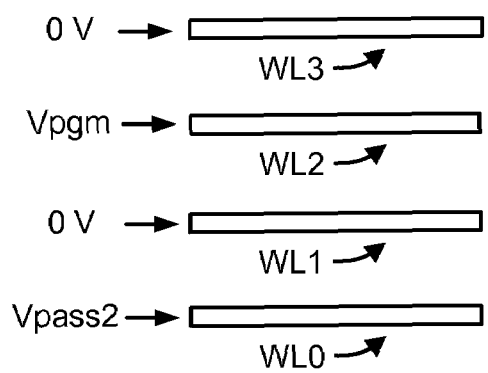
Figure 14E:
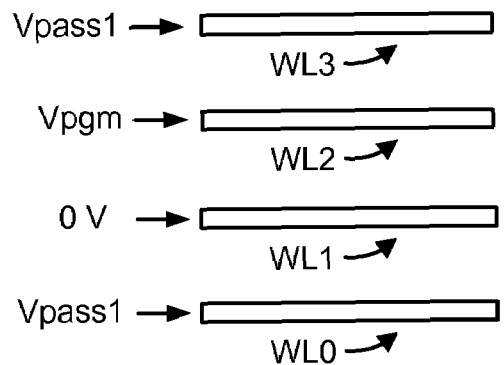
Figure 14F:
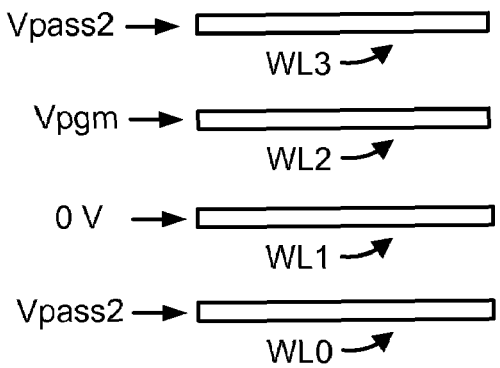

FIGS. 14C and 14D show the voltages which are applied to the word lines for the initial programming and reprogramming, respectively, for a local self-boosting (LSB) technique. FIGS. 14E and 14F show the voltages which are applied to the word lines for the initial programming and reprogramming, respectively, for an erased area self-boosting (EASB) technique. LSB and EASB attempt to address the shortcomings of conventional self boosting by isolating the channel of previously programmed storage elements from the channel of the storage element being inhibited. For example, referring also to FIG. 4, if storage element 424 is being programmed, LSB and EASB attempt to inhibit programming in storage element 444 by isolating the channel of storage element 444 from the previously programmed storage elements (445 and 446). For the SB, EASB, and LSB boosting methods, or variations of these boosting methods, the bit line for the storage element being programmed is at ground or connected to another voltage close to 0 V, typically in a 0-1 V range, while the bit line of the NAND string with the storage element being inhibited is at Vdd, typically about 1.5-3 V. The program voltage Vpgm (e.g., 20 V) is connected to the selected word line. For LSB, the word lines neighboring the selected word line are at, or close to, 0 V, while the remaining non-selected word lines are at Vpass1 or Vpass2. For example, bit line 421 can be at 0 V while bit line 441 is at Vdd. Drain select SCG is at Vsgd (typically 2.5-4.5 V) and source select SGS is at 0 V. Referring to FIGS. 14C and 14D, the selected word line WL2 is at Vpgm, while neighboring word lines WL1 and WL3 are at 0 V, and other word lines (e.g., WL0) are at Vpass1 or Vpass2.

A disadvantage of the LSB mode is that the boosted channel voltage under the selected word line can be very high since that part of the channel is isolated from the other channel areas under the unselected word lines and, thus, the boosting voltage is mainly determined by the high programming voltage, Vpgm. Due to the high boosting, band-to-band tunneling or GIDL near the word lines that are biased to 0 V can occur. The amount of channel boosting can be limited to a lower value by using EASB. EASB is similar to LSB with the exception that only the source side neighbor word line is at 0 V. For example, referring to FIGS. 14E and 14F, the selected word line WL2 is at Vpgm, while the source side neighboring word line WL1 is at 0 V, and the other word lines (e.g., WL0 and WL3), are at Vpass1 or Vpass2. With this approach, the channel area under the selected word line and the channel area under the drain side neighbor word line of the selected storage elements are connected and, thus, the channel boosting is determined mainly by the pass voltage that is applied to the unselected word lines instead of by Vpgm as for the LSB case. The drain side neighbor word line, WL3, is at Vpass1 or Vpass2. If Vpass is too low, boosting in the channel will be insufficient to prevent program disturb. If Vpass1 or Vpass2 is too high, unselected word lines in a selected NAND string (with 0 V on the bit line) may be programmed, or program disturb due to GIDL may occur.

Use of Flags to Determine Appropriate Read Voltages

FIG. 15 is a flow chart describing one embodiment of a process for reading pages of data in a block of non-volatile storage using flags. While the process is described in terms of a block of storage elements, it is generally applicable to any set of storage elements. Data in a block occasionally is read as needed. The data may be read from pages in a block which have completed the initial programming and/or the reprogramming. When higher $V_{TH}$ verify levels are used in the reprogramming, higher read levels can be used when reading the data. Thus, it is desirable to know the programming status of a page before reading it.

To this end, each page can have a dedicated binary encoded storage element residing in the same page, for instance, whose binary state is used as a flag. As read operations proceed into a new block, the first page of the block can be read with the assumption that the page has been block reprogrammed. If the results of the read indicate otherwise, then the page can be read again with the lower set of read levels. The subsequent pages are likely to have the same programming status (reprogrammed or not) as the first page. Therefore, they can be read in the mode corresponding to the first page until an error correcting code (ECC) error raises the possibility of having used the wrong page state, in which case the page and all subsequent pages in the block can be read under the alternative read voltages. Moreover, after having read any page, the status of its flag can be checked against the assumed read voltages, and if a contradiction is found, the page can be re-read using the alternative read voltages. This can be done even if the first improper read did not result in ECC errors.

In an example implementation, at step 1500, the control begins to read a page of data. At step 1505, the block flag of the block in which the page is located is read to determine the programming status. Alternatively, one or more page flags can be read to determine the programming status, as discussed in connection with FIG. 12. At step 1510, if the block/page flag or flags indicate that the reprogramming has been completed for the block, the second, higher set of $V_{TH}$ read levels are used, at step 1535. For example, these may be Vra2, Vrb2 and Vrc2 from FIG. 7B. At step 1540, the page of data is read using the second, higher set of $V_{TH}$ read levels. If an additional page in the block is to be read, at step 1545, and the reprogramming has been completed (step 1510), the additional page of data is read at step 1540 using the second, higher set of $V_{TH}$ read levels obtained at step 1535. The read process ends at step 1550 if there are no further pages to read.

On the other hand, if the block/page flag or flags do not indicate that the reprogramming has been completed for the block, at step 1510, the page flag is read at step 1515 to determine if only the initial programming has been completed for the page, at step 1520, or if the reprogramming has also been completed for the page, at step 1530. If only the initial programming has been completed, the first, lower set of $V_{TH}$ read levels is used, at step 1525. For example, these may be Vra1, Vrb1 and Vrc1 from FIG. 7A. If the reprogramming has also been completed, the second, higher set of $V_{TH}$ read levels is used, at step 1535, and the page of data is read at step 1540, as discussed previously. The process is repeated until no additional pages are to be read. Thus, the appropriate read levels can be used for each page in the block based on their associated programming status.

Use of Error Count to Determine Appropriate Read Voltages

Figure 16:
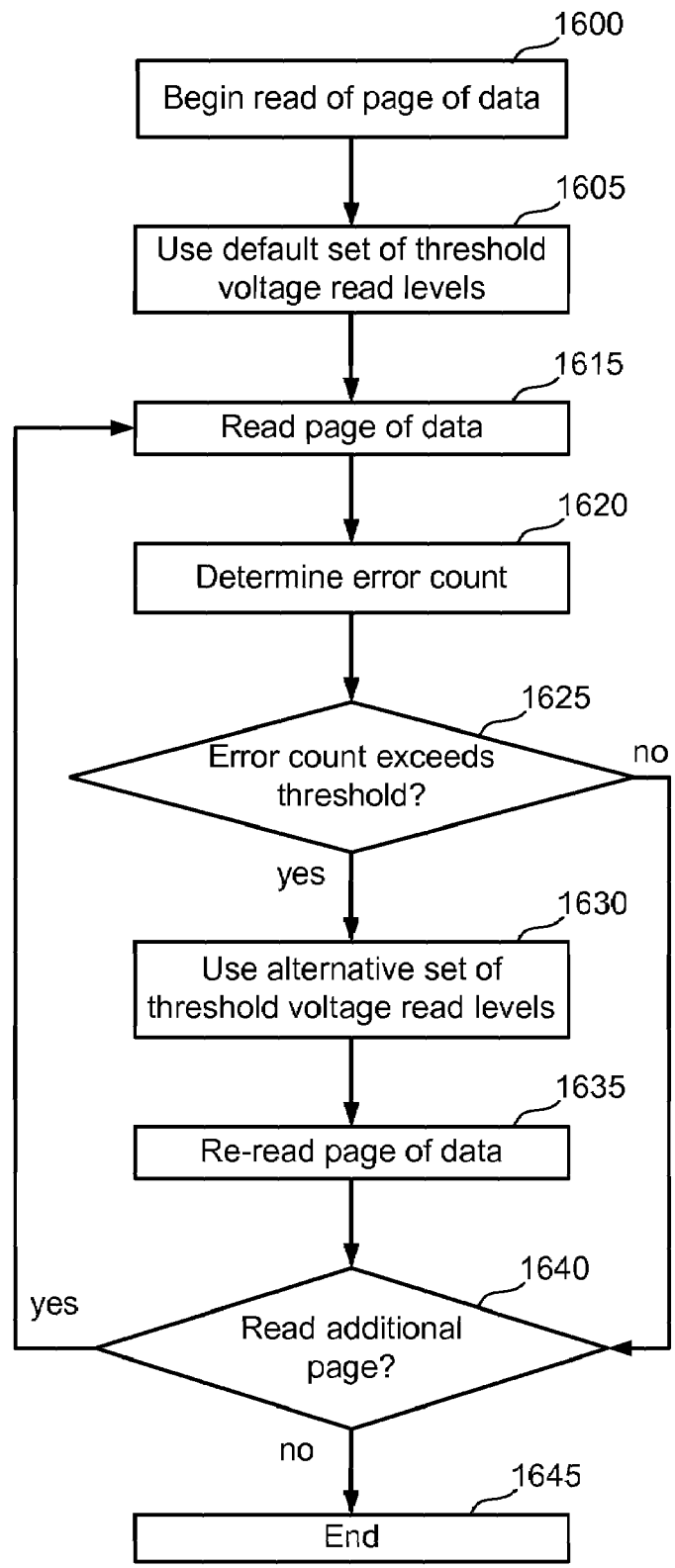
FIG. 16 is a flow chart describing one embodiment of a process for reading pages of data in a block of non-volatile storage using an error count.

FIG. 16 is a flow chart describing one embodiment of a process for reading pages of data in a block of non-volatile storage using an error count. While the process is described in terms of a block of storage elements, it is generally applicable to any set of storage elements. In this approach, there is no need for page or block level flags to identify the programming status of a page or block, respectively. Instead, the control circuitry can read a page assuming a given programming status, e.g., either the initial programming only has been completed or the reprogramming has also been completed, and rely on an error count to determine whether the assumption is correct. If it is determined that the assumption is incorrect, and the wrong read voltages were used, an alternative set of read voltages is used to re-read the storage elements.

In an example implementation, at step 1600, the control begins to read a page of data. At step 1605, the default set of $V_{TH}$ read levels are used, e.g., either the lower levels Vra1, Vrb1 and Vrc1 from FIG. 7A, or the higher levels Vra2, Vrb2 and Vrc2 from FIG. 7B. At step 1615, the page is read using the default or assumed $V_{TH}$ read levels and, at step 1620, an error count for the page is determined. For example, the error count may be based on errors detected by an error correcting or detecting code. Error correcting codes, such as Hamming codes, can detect and correct some errors, while error detecting codes, such as those using parity bits or checksums, can only detect errors without correcting them. For example, as discussed previously in connection with FIG. 6, a page may include a number of sectors of data with associated ECC data. When the sectors are written to the storage elements, the additional error correcting or detecting bits are written. These bits are generated from the sectors of data using an error correcting or detecting code. Subsequently, when the sectors are read, the accompanying error correcting or detecting bits are also read. The sector data is then run through the error correcting or detecting code to see if the output is consistent with the error correcting or detecting bits. If the output is not consistent, there is an error in the sector. Accordingly, an error count can be generated based on a number of errors which are detected for a sector or other unit. The count may include all detected errors, including those which can be corrected, or only errors which cannot be corrected, for instance. The count can be expressed as a raw count, a percentage, or other metric.

At step 1625, if the error count exceeds a threshold, it can be concluded that the default set of $V_{TH}$ read levels which was used was incorrect. In this case, an alternative set of $V_{TH}$ read levels is used, at step 1630. For example, if the default set includes the lower read levels Vra1, Vrb1 and Vrc1 from FIG. 7A, then the alternative set can include the higher read levels Vra2, Vrb2 and Vrc2 from FIG. 7B. Conversely, if the default set includes the higher read levels, then the alternative set can include the lower read levels. The approach can be extended to more than one alternate set of read levels as well. At step 1635, the page is re-read with the alternative read levels. If there is an additional page to read, at step 1640, the page is read using the most recently used set of read levels, at step 1615, and an error count is determined, at step 1620. The process then proceeds as discussed. At step 1625, if the error count does not exceed the threshold, and if there is no additional page to read, at step 1640, the process ends, at step 1645. If there is an additional page to read, at step 1640, the page is read using the most recently used set of read levels, at step 1615.

The error threshold can be set at a level based on experience with a particular memory device, taking into account the error count which is typically experienced when the correct read levels are used. An error count can be deemed indicative of incorrect read levels when it departs, by a prescribed amount, from the error count which is typically experienced when the correct read levels are used. Testing, modeling and experimentation can be used to set an appropriate threshold. It is also possible to determine an error count when the alternative read levels are used and compare it to the error count when the default read levels are used. The read levels which result in the lower error count can then be used as the final read levels.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:

programming a block of non-volatile storage elements via a plurality of word lines in an initial programming, the initial programming is performed in a word line order staffing from a first word line of the block and proceeding successively to each next word line until a last word line of the block is reached; and after the initial programming of the block is completed, performing further programming of at least some of the non-volatile storage elements, the further programming is performed in the word line order of the initial programming, staffing from the first word line of the block and proceeding successively to each next word line until the last word line of the block is reached; where:

the first word line is a source side word line of the block;

the last word line is a drain side word line of the block;

the initial programming proceeds one word line at a time from the source side word line to the drain side word line; and the further programming proceeds one word line at a time from the source side word line to the drain side word line.

2. The method of claim 1, further comprising:
determining when the initial programming has been completed for the last word line; and
responsive to the determining, storing programming status information for the block that indicates that the initial programming has been completed for the block.

3. The method of claim 1, wherein:
the initial programming uses a first set of different threshold voltage verify levels, and the further programming uses a second set of different threshold voltage verify levels, each threshold voltage verify level in the second set is higher than a corresponding voltage verify level in the first set.

4. The method of claim 1, further comprising:
after the initial programming and before the further programming, storing programming status information that indicates that the further programming has not yet been completed for the block; and
after the further programming, storing programming status information that indicates that the further programming has been completed for the block.

5. The method of claim 1, wherein:
the block is not erased after the initial programming and before the further programming.

6. The method of claim 1, further comprising:
temporarily stopping, implementing a wait, and later restarting the further programming multiple times before the further programming is completed.

7. The method of claim 1, wherein:
the further programming programs an integer number of pages of data before temporarily stopping, implementing a wait and later restarting to further program a next page of data.

8. A method for operating non-volatile storage, comprising:
programming a block of non-volatile storage elements via a plurality of word lines in an initial programming, including: selecting one word line at a time, applying program voltages to the selected word line during the initial programming, applying a first set of verifying voltages to the selected word line during the initial programming, and applying pass voltages to unselected word lines while applying the program voltages during the initial programming; and
after the initial programming of the block is completed, performing further programming of at least some of the non-volatile storage elements, including: selecting one word line at a time, applying program voltages to the selected word line during the further programming, applying a second set of verifying voltages to the selected word line during the further programming, and applying pass voltages to unselected word lines while applying the program voltages during the further programming, a level of the pass voltages differs between the initial programming and the further programming.

9. The method of claim 8, further comprising:
the level of the pass voltages is higher during the further programming than during the initial programming.

10. A non-volatile storage system, comprising:
a block of non-volatile storage elements;
one or more circuits for programming the block of non-volatile storage elements via a plurality of word lines in an initial programming, the initial programming is performed in a word line order starting from a first word line of the block and proceeding successively to each next word line until a last word line of the block is reached, and after the initial programming of the block is completed, the one or more circuits perform further programming of at least some of the non-volatile storage elements, the further programming is performed in the word line order of the initial programming, starting from the first word line of the block and proceeding successively to each next word line until the last word line of the block is reached, the initial programming uses a first set of different threshold voltage verify levels, and the further programming uses a second set of different threshold voltage verify levels, each threshold voltage verify level in the second set is higher than a corresponding voltage verify level in the first set.

11. The non-volatile storage system of claim 10, wherein:
the one or more circuits determine when the initial programming has been completed for the last word line, and responsive to the determining, the one or more circuits store programming status information for the block that indicates that the initial programming has been completed for the block.

12. The non-volatile storage system of claim 10, wherein:
the first word line is a source side word line of the block;
the last word line is a drain side word line of the block;
the initial programming proceeds one word line at a time from the source side word line to the drain side word line; and
the further programming proceeds one word line at a time from the source side word line to the drain side word line.

13. The non-volatile storage system of claim 10, wherein:
after the initial programming and before the further programming, the one or more circuits store programming status information that indicates that the further programming has not yet been completed for the block; and
after the further programming, the one or more circuits store programming status information that indicates that the further programming has been completed for the block.

14. The non-volatile storage system of claim 10, wherein:
the block is not erased after the initial programming and before the further programming.

15. The non-volatile storage system of claim 10, wherein:
the one or more circuits temporarily stop, implement a wait and later restart the further programming multiple times before the further programming is completed.

16. The non-volatile storage system of claim 10, wherein:
the one or more circuits perform the further programming by programming an integer number of pages of data before temporarily stopping, implementing a wait, and later restarting to further program a next page of data.

* * * * *

UNITED STATES PATENT AND TRADEMARK OFFICE
CERTIFICATE OF CORRECTION

PATENT NO. : 7,633,802 B2 Page 1 of 1
APPLICATION NO. : 12/344779
DATED : December 15, 2009
INVENTOR(S) : Mokhlesi It is certified that error appears in the above-identified patent and that said Letters Patent is hereby corrected as shown below:

Col. 24, line 60: After "programming," and before "from" delete "staffing" and substitute with --starting--

Signed and Sealed this

Thirteenth Day of July, 2010

David J. Kappos
*Director of the United States Patent and Trademark Office*